US009865575B2

(12) United States Patent
Chi et al.

(10) Patent No.: US 9,865,575 B2
(45) Date of Patent: Jan. 9, 2018

(54) METHODS OF FORMING CONDUCTIVE AND INSULATING LAYERS

(71) Applicant: STATS ChipPAC Pte. Ltd., Singapore (SG)

(72) Inventors: HeeJo Chi, Kyoungki-do (KR); HanGil Shin, Seoul (KR); KyungMoon Kim, Gyeonggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 15/202,349

(22) Filed: Jul. 5, 2016

(65) Prior Publication Data

US 2016/0329310 A1    Nov. 10, 2016

Related U.S. Application Data

(63) Continuation of application No. 13/929,776, filed on Jun. 27, 2013, now Pat. No. 9,406,533.

(51) Int. Cl.
*H01L 25/10* (2006.01)
*H01L 23/498* (2006.01)
(Continued)

(52) U.S. Cl.
CPC ...... *H01L 25/105* (2013.01); *H01L 23/49816* (2013.01); *H01L 23/49822* (2013.01); *H01L 23/49827* (2013.01); *H01L 23/5389* (2013.01); *H01L 24/14* (2013.01); *H01L 24/17* (2013.01); *H01L 24/29* (2013.01); *H01L 24/32* (2013.01); *H01L 24/48* (2013.01); *H01L 24/83* (2013.01); *H01L 21/563* (2013.01); *H01L 23/3128* (2013.01); *H01L 24/13* (2013.01); *H01L 24/16* (2013.01); *H01L 2224/131* (2013.01); *H01L 2224/13147* (2013.01); *H01L 2224/16225* (2013.01); *H01L 2224/16227* (2013.01); *H01L 2224/2919* (2013.01); *H01L 2224/32225* (2013.01); *H01L 2224/48225* (2013.01); *H01L 2224/73204* (2013.01); *H01L 2224/73265* (2013.01); *H01L 2224/831* (2013.01);
(Continued)

(58) Field of Classification Search
CPC .................. H01L 25/105; H01L 23/49816
See application file for complete search history.

(56) References Cited

U.S. PATENT DOCUMENTS 6,108,210 A    8/2000 Chung
6,429,515 B1   8/2002 Glenn
(Continued)

*Primary Examiner* — Zandra Smith
*Assistant Examiner* — Andre C Stevenson
(74) *Attorney, Agent, or Firm* — Robert D. Atkins; Patent Law Group: Atkins and Associates, P.C.

(57) ABSTRACT

Methods of forming conductive and insulating layers for semiconductor devices and packages. Substrate is provided with integrated circuit device and interconnect structure mounted thereon, the interconnect structure adjacent the integrated circuit device. The integrated circuit device and portions of the interconnect structure can be covered with an encapsulation exposing a portion of the interconnect structure. Conductive material is formed over the exposed portion of the interconnect structure by a depositing process followed by a heating process to alter the chemical properties of the conductive material. Optionally, a dispersing process may be incorporated.

25 Claims, 18 Drawing Sheets

(51) Int. Cl.
  *H01L 23/538*   (2006.01)
  *H01L 23/31*    (2006.01)
  *H01L 21/56*    (2006.01)
  *H01L 23/00*    (2006.01)

(52) U.S. Cl.
  CPC ........... *H01L 2224/8385* (2013.01); *H01L 2225/1023* (2013.01); *H01L 2225/1041* (2013.01); *H01L 2225/1058* (2013.01); *H01L 2924/00014* (2013.01); *H01L 2924/01322* (2013.01); *H01L 2924/12041* (2013.01); *H01L 2924/12042* (2013.01); *H01L 2924/13091* (2013.01); *H01L 2924/15311* (2013.01); *H01L 2924/181* (2013.01); *H01L 2924/18161* (2013.01)

(56) References Cited

U.S. PATENT DOCUMENTS

| | | | |
|---|---|---|---|
| 6,830,778 B1 | 12/2004 | Schulz et al. | |
| 6,967,299 B2 * | 11/2005 | Howie | H01H 13/702 200/296 |
| 7,061,125 B2 | 6/2006 | Cho et al. | |
| 7,839,649 B2 | 11/2010 | Hsu | |
| 7,884,466 B2 | 2/2011 | Ishihara et al. | |
| 7,979,789 B2 | 7/2011 | Ammerlaan et al. | |
| 8,093,721 B2 | 1/2012 | Kang et al. | |
| 8,227,910 B2 | 7/2012 | Pagaila et al. | |
| 8,283,205 B2 | 10/2012 | Pagaila et al. | |
| 8,288,210 B2 | 10/2012 | Lee et al. | |
| 8,318,540 B2 | 11/2012 | Beer | |
| 8,334,464 B2 | 12/2012 | Edwards et al. | |
| 8,362,612 B1 | 1/2013 | Paek et al. | |
| 8,404,520 B1 | 3/2013 | Chau et al. | |
| 8,557,679 B2 | 10/2013 | Chuang et al. | |
| 8,652,860 B2 | 2/2014 | West et al. | |
| 8,669,655 B2 | 3/2014 | Geitner et al. | |
| 8,710,854 B2 * | 4/2014 | Burberry | G06F 3/044 324/679 |
| 2005/0242422 A1 * | 11/2005 | Klein | H01L 21/563 257/686 |
| 2006/0175695 A1 | 8/2006 | Lee | |
| 2007/0195123 A1 | 8/2007 | Deguchi et al. | |
| 2008/0023805 A1 | 1/2008 | Howard et al. | |
| 2009/0309212 A1 | 12/2009 | Shim et al. | |
| 2011/0157853 A1 * | 6/2011 | Goh | H01L 21/563 361/783 |
| 2011/0260334 A1 | 10/2011 | Hasegawa | |
| 2012/0056316 A1 | 3/2012 | Pagaila et al. | |

\* cited by examiner

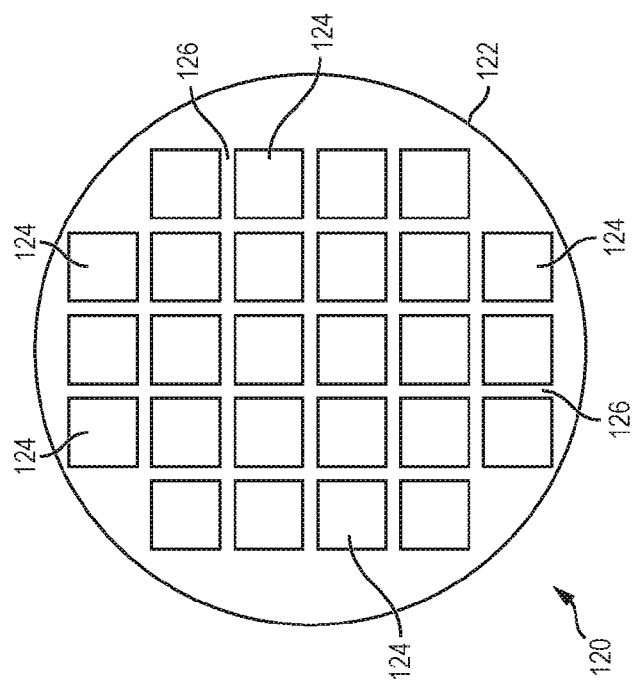
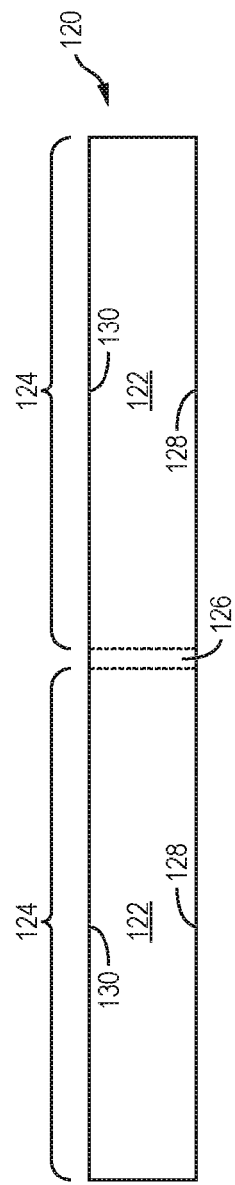

METHODS OF FORMING CONDUCTIVE AND INSULATING LAYERS

CLAIM TO DOMESTIC PRIORITY

The present application is a continuation of U.S. patent application Ser. No. 13/929,776, now U.S. Pat. No. 9,406,533, filed Jun. 27, 2013, which application is incorporated herein by reference.

FIELD OF THE INVENTION

The present disclosure relates in general to semiconductor devices and, more particularly, to methods of forming conductive and insulating layers for semiconductor devices and packages.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

SUMMARY OF THE INVENTION

Methods of forming conductive and insulating layers for semiconductor devices and packages are disclosed. In one embodiment, a method of forming conductive layers for semiconductor devices and packages includes (a) providing a substrate having an upper surface and a lower surface, where the lower surface opposite the upper surface, and (b) mounting a first integrated circuit device over the upper surface of the substrate. Next, the method includes (c) mounting an interconnect structure over the upper surface of the substrate, where the interconnect structure adjacent the first integrated circuit device. The mounting steps (b) and (c) can be carried out concurrently, if desired. Next, the method includes (d) covering the first integrated circuit device and portions of the interconnect structure with an encapsulation material leaving an upper portion of the interconnect structure exposed, followed by (e) forming a first conductive material over the upper portion of the interconnect structure and the encapsulation material. In this embodiment, the forming step (e) includes the following sub-steps: (i) depositing the first conductive material having a first state, and (ii) heating the first conductive material from the first state to a second state, where the second state is different from the first state.

In one embodiment, the method further includes mounting a semiconductor package over the first conductive material, where the semiconductor package includes a second integrated circuit device. In another embodiment, the method further includes forming a plurality of external interconnects on the lower surface of the substrate, where the external interconnects are in communication with at least one of the first integrated circuit device and the second integrated circuit device. In yet another embodiment, the method further includes treating the upper portion of the interconnect structure with a deflashing process after the covering step (d) but before the forming step (e).

In some embodiments, the depositing step (i) of the forming step (e) includes depositing the first conductive material including at least one of silver (Ag), platinum (Pt), gold (Au), copper (Cu), carbon nanotube (CNT), graphene, organic metal, and mixtures thereof. In other embodiments, the method further includes treating the upper portion of the interconnect structure with hydrophilic plasma prior to the forming step (e). In one embodiment, the method further includes forming a second conductive material over the first conductive material, where the second conductive material and the first conductive material having substantially similar geometric footprint. In another embodiment, the method further includes forming an isolating material over the encapsulation material, where a first portion of the isolating material is formed over the first conductive material and the second conductive material, and where a second portion of the isolating material is formed in between and adjacent to the first conductive material and the second conductive material.

In one embodiment, a method of forming conductive layers for semiconductor devices and packages includes (a) providing a substrate having an upper surface and a lower surface, where the lower surface is opposite the upper surface, (b) mounting a first integrated circuit device over the upper surface of the substrate, and (c) mounting an interconnect structure over the upper surface of the substrate, where the interconnect structure is adjacent the first integrated circuit device. The mounting steps (b) and (c) can be carried out concomitantly. The method further includes (d) covering the first integrated circuit device and portions of the interconnect structure with an encapsulation material leaving an upper portion of the interconnect structure exposed, and (e) forming a conductive material over the upper portion of the interconnect structure and the encapsulation material. In one embodiment, the forming step (e) includes the following sub-steps: (i) depositing the conductive material having a first state, and (ii) heating the conductive material from the first state to a second state, where the second state is different from the first state. The method further includes (f) forming an isolating material over the encapsulation material, where a first portion of the isolating material is formed over the conductive material, and where a second portion of the isolating material is formed in between and adjacent to the conductive material.

In one embodiment, the method further includes (g) mounting a semiconductor package over the conductive material and the isolating material, where the semiconductor package includes a second integrated circuit device. In another embodiment, the method further includes forming a plurality of external interconnects on the lower surface of the substrate, where the external interconnects are in communication with at least one of the first integrated circuit device and the second integrated circuit device. In yet another embodiment, the method further includes treating the upper portion of the interconnect structure with a deflashing process after the covering step (d) but before the forming step (e).

In one embodiment, the forming step (f) includes forming the isolating material including at least one of dielectric ink, dielectric paste, thermosetting resin, and mixtures thereof. In another embodiment, the method further includes treating the upper portion of the interconnect structure with hydrophilic plasma prior to the forming step (e).

In one embodiment, a method of forming conductive layers for semiconductor devices and packages includes (a) providing a substrate having an upper surface and a lower surface, where the lower surface is opposite the upper surface, (b) mounting a first integrated circuit device over the upper surface of the substrate, and (c) mounting an interconnect structure over the upper surface of the substrate, where the interconnect structure is adjacent the first integrated circuit device. Next, the method includes (d) covering a peripheral portion of the first integrated circuit device and a peripheral portion of the interconnect structure with an encapsulation material leaving an upper surface of the first integrated circuit device and an upper portion of the interconnect structure exposed, followed by (e) forming an insulating material over the upper surface of the first integrated circuit device. In one embodiment, the forming step (e) includes: (i) depositing the insulating material having a first state, and (ii) heating the insulating material from the first state to a second state, where the second state is different from the first state. Next, the method includes (f) forming a first conductive material over the insulating material extending from the upper surface of the first integrated circuit device to the upper portion of the interconnect structure. In one embodiment, the forming step (f) includes: (i) depositing the first conductive material having a third state, and (ii) heating the first conductive material from the third state to a fourth state, where the fourth state is different from the third state.

In one embodiment, the method further includes (g) mounting a semiconductor package over the first conductive material, where the semiconductor package includes a second integrated circuit device. In another embodiment, the method further includes forming a plurality of external interconnects on the lower surface of the substrate, where the external interconnects are in communication with at least one of the first integrated circuit device and the second integrated circuit device. In yet another embodiment, the method further includes treating the upper portion of the interconnect structure with a deflashing process after the forming step (e) but before the forming step (f).

In one embodiment, the depositing step (i) of the forming step (e) includes depositing the insulating material including at least one of dielectric ink, dielectric paste, thermosetting resin, and mixtures thereof. In another embodiment, the depositing step (i) of the forming step (f) includes depositing the first conductive material including at least one of silver (Ag), platinum (Pt), gold (Au), copper (Cu), carbon nanotube (CNT), graphene, organic metal, and mixtures thereof. In one embodiment, the method further includes treating the upper portion of the interconnect structure with hydrophilic plasma prior to the forming step (f). In another embodiment, the method further includes (g) forming a second conductive material over the first conductive material, where the second conductive material and the first conductive material have substantially similar geometric footprint. In yet another embodiment, the method further includes (h) forming an isolating material over the upper surface of the first integrated circuit device, where a first portion of the isolating material is formed over the first conductive material and the second conductive material, and where a second portion of the isolating material is formed in between and adjacent to the first conductive material and the second conductive material.

In one embodiment, a method of forming conductive layers for semiconductor devices and packages includes (a) providing a substrate having an upper surface and a lower surface, where the lower surface is opposite the upper surface, (b) mounting a first integrated circuit device over the upper surface of the substrate, and (c) mounting an interconnect structure over the upper surface of the substrate, where the interconnect structure is adjacent the first integrated circuit device. Next, the method includes (d) covering a peripheral portion of the first integrated circuit device and a peripheral portion of the interconnect structure with an encapsulation material leaving an upper surface of the first integrated circuit device and an upper portion of the interconnect structure exposed, followed by (e) forming an insulating material over the upper surface of the first integrated circuit device. In one embodiment, the forming step (e) includes the following sub-steps: (i) depositing the insulating material having a first state, and (ii) heating the insulating material from the first state to a second state, where the second state is different from the first state. Next, the method includes (f) forming a conductive material over the insulating material extending from the upper surface of the first integrated circuit device to the upper portion of the interconnect structure. In this embodiment, the forming step (f) includes the following sub-steps: (i) depositing the conductive material having a third state, and (ii) heating the conductive material from the third state to a fourth state, where the fourth state is different from the third state. Next, the method includes (g) forming an isolating material over the upper surface of the first integrated circuit device, where a first portion of the isolating material is formed over the conductive material, and where a second portion of the isolating material is formed in between and adjacent to the conductive material.

In one embodiment, the method further includes (h) mounting a semiconductor package over the conductive material and the isolating material, where the semiconductor package includes a second integrated circuit device. In another embodiment, the method further includes forming a plurality of external interconnects on the lower surface of the substrate, where the external interconnects are in communication with at least one of the first integrated circuit device and the second integrated circuit device. In some embodiments, the method includes treating the upper portion of the interconnect structure with a deflashing process after the forming step (e) but before the forming step (f). In other embodiments, the depositing step (i) of the forming step (e) includes depositing the insulating material including at least one of dielectric ink, dielectric paste, thermosetting resin, and mixtures thereof. In some embodiments, the forming step (g) includes forming the isolating material including at least one of dielectric ink, dielectric paste, thermosetting resin, and mixtures thereof. In other embodiments, the method further includes treating the upper portion of the interconnect structure with hydrophilic plasma prior to the forming step (f).

Other variations, embodiments and features of the present disclosure will become evident from the following detailed description, drawings and claims.

BRIEF DESCRIPTION OF THE DRAWINGS

FIGS. 3a-3b illustrate details of a representative semiconductor substrate;

DETAILED DESCRIPTION OF THE DRAWINGS

Figure 1:
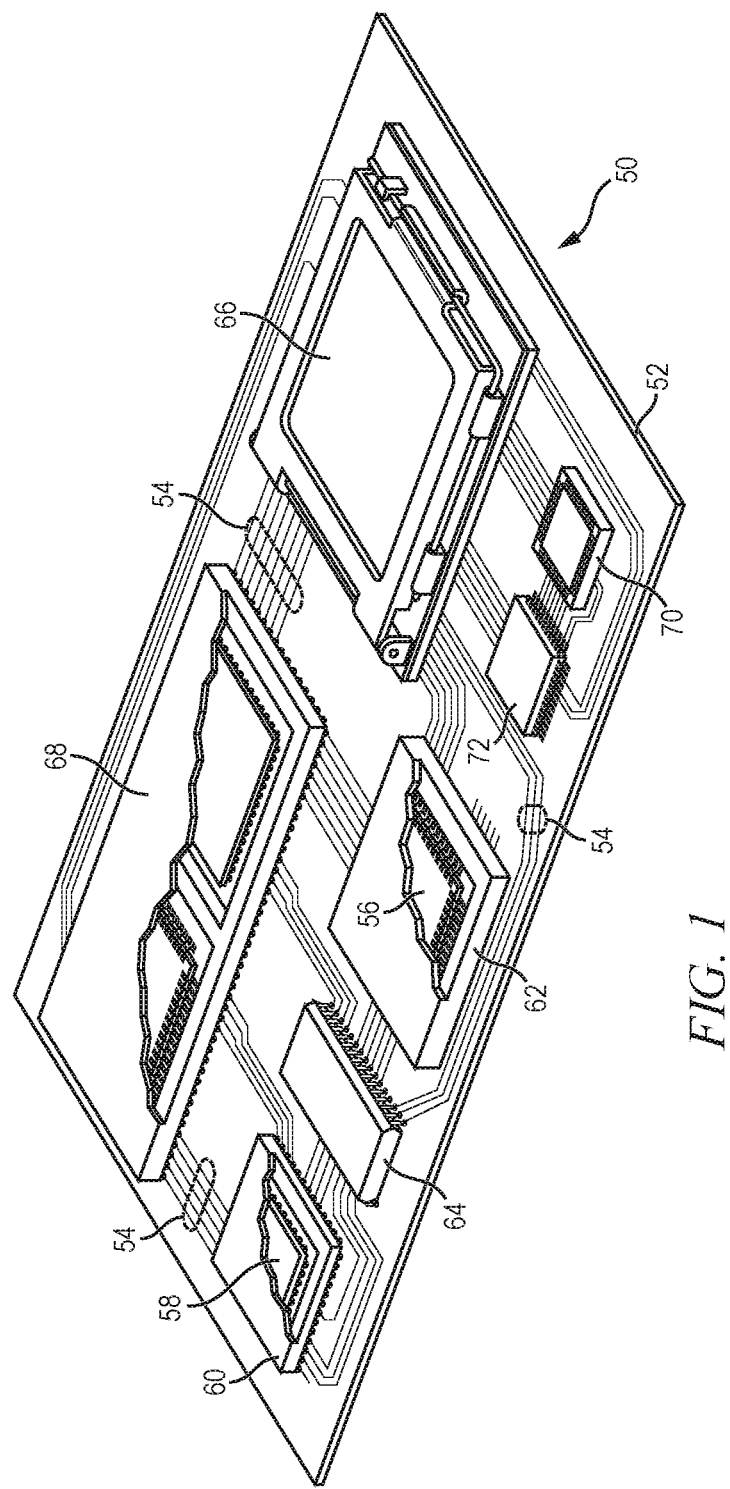
FIG. 1 illustrates a printed circuit board (PCB) with different types of packages mounted to its surface.

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

The present disclosure is described in one or more embodiments in the following description with reference to the figures, in which like numerals represent the same or similar elements. While the disclosure is described in terms of the best mode for achieving the disclosure's objectives, it will be appreciated by those skilled in the art that it is intended to cover alternatives, modifications, and equivalents as may be included within the spirit and scope of the disclosure as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
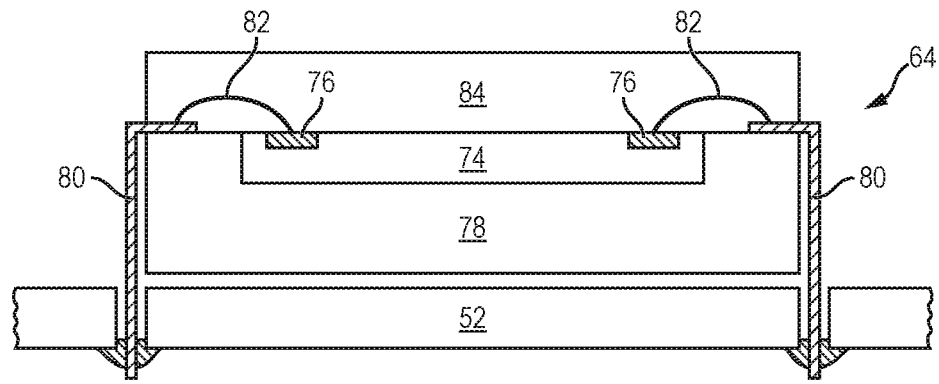
FIGS. 2a-2c illustrate further detail of the representative semiconductor packages mounted to the PCB.
Figure 2B:
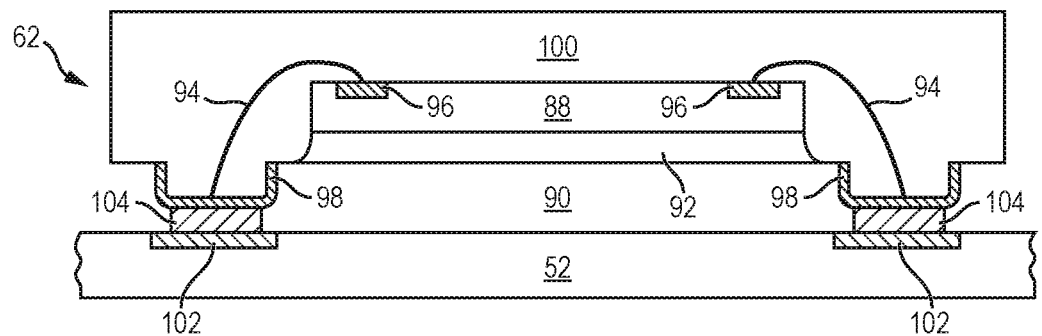
Figure 2C:
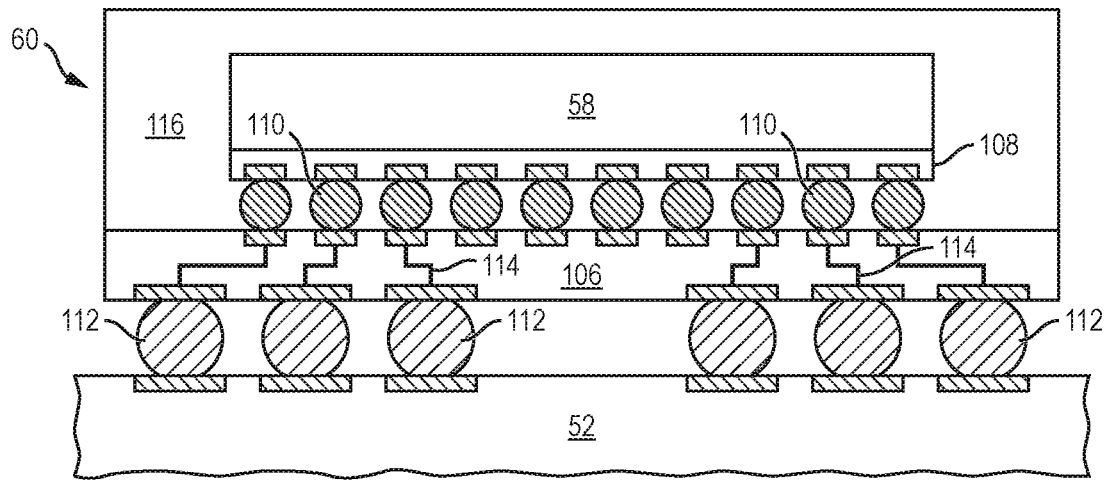

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

Figure 4:
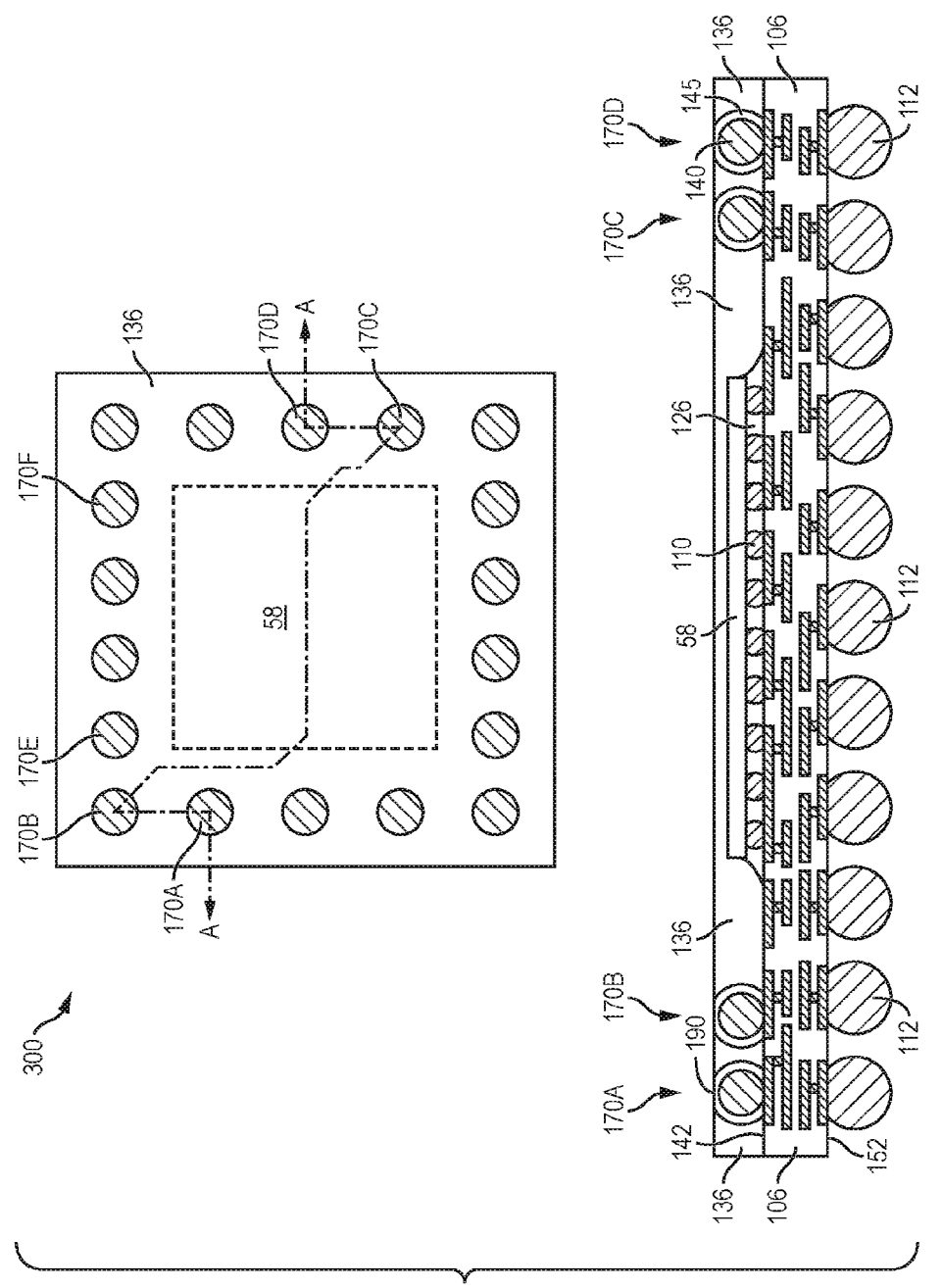
FIGS. 4-6 are top-down and cross-sectional views of a method of forming conductive layers on a semiconductor package according to one embodiment.
Figure 5:
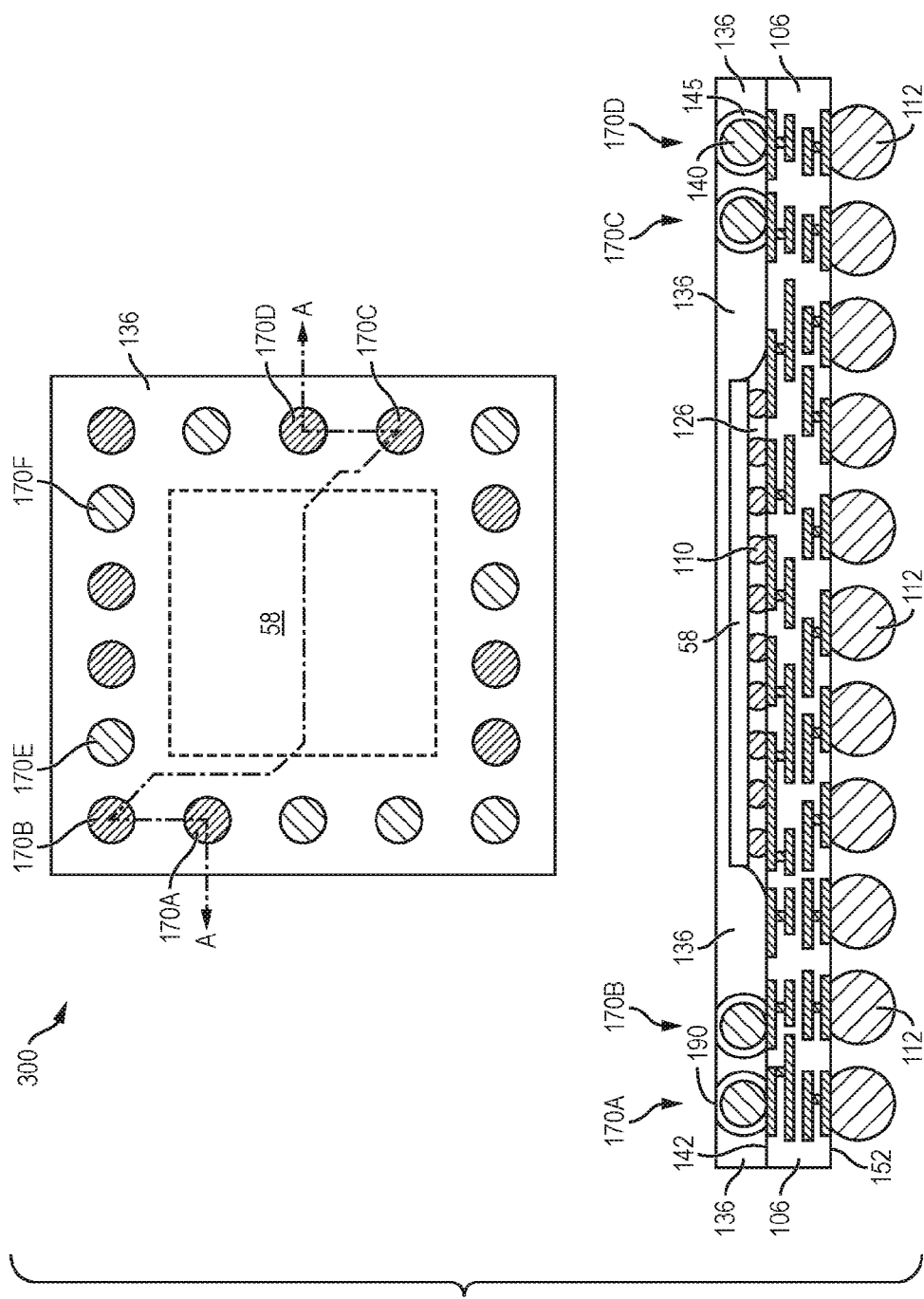
Figure 6:
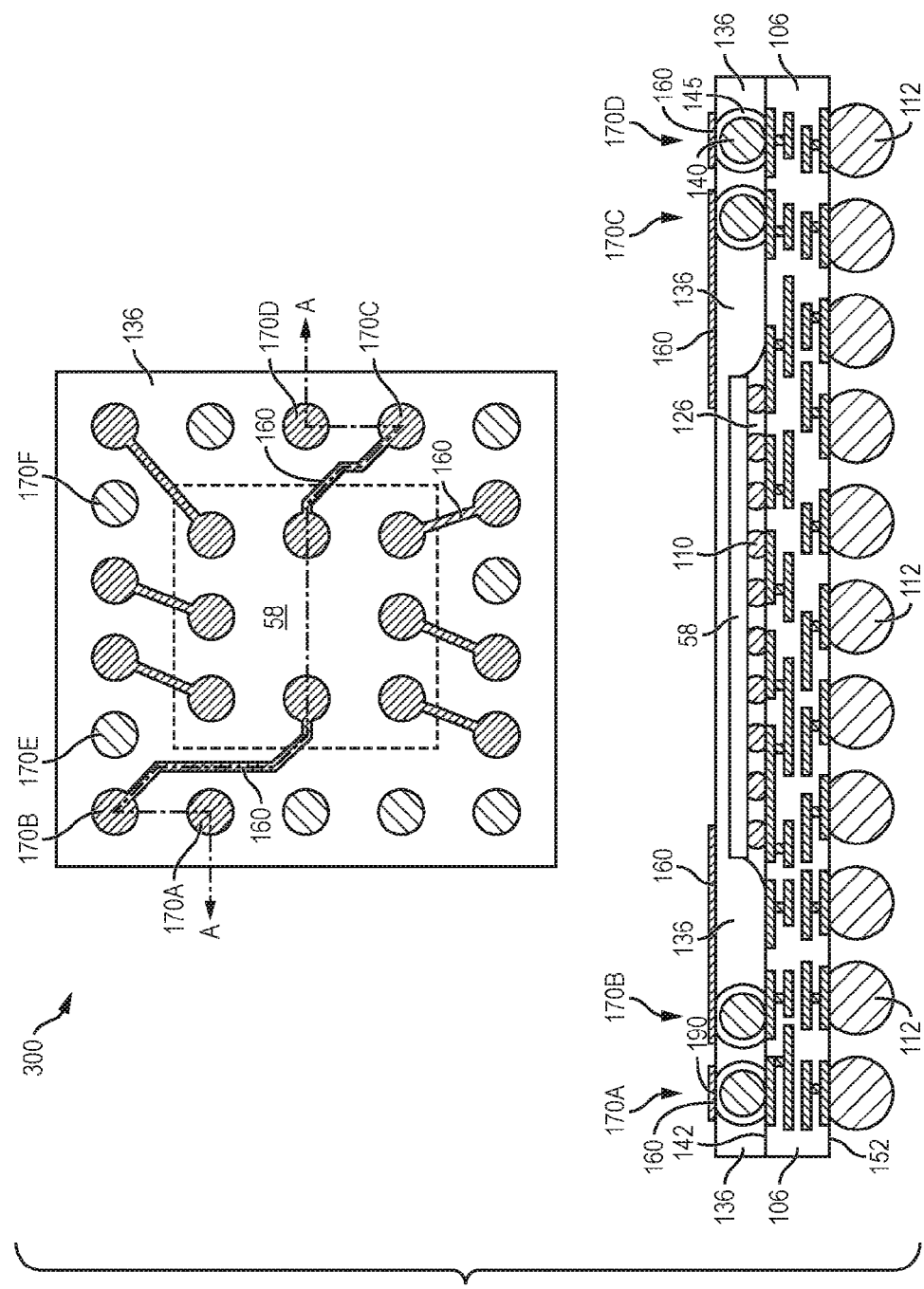

FIGS. 4-6 are top-down and cross-sectional views of a method of forming conductive layers on a semiconductor package 300 according to one embodiment of the present disclosure. FIG. 4 includes a top-down view of the semiconductor package 300 with a cross-sectional view through A-A of the semiconductor package 300. As shown, the package 300 includes a substrate 106 having an upper surface 142 and a lower surface 152. In this instance, the lower surface 152 is opposite the upper surface 142. The substrate 106 can be a semiconductor wafer or a chip carrier similar to those described above. For example, the substrate 106 can be laminate, printed circuit board (PCB), silicon, organic, ceramic, plastic or some other laminated or flexible structure for redistribution of signals. In some embodiments, the substrate 106 can be a silicon wafer, an interposer or a redistribution material, among other suitable semiconductor substrates.

An integrated circuit device 58 can be mounted on or attached to the upper surface 142 of the substrate 106 via a plurality of internal connectors or bumps 110. The internal connectors 110 may be solder bumps, solder balls, copper pillars, copper balls, among others. The bumps 110 may be underfilled or encapsulated with a molding compound 126 such as an epoxy resin material, along with portions of the lower surface of the integrated circuit device 58 facing the substrate 106. The process of forming the encapsulation 126 can be carried out using film-assisted molding, epoxy molding, moldable underfill or other protective molding process. The encapsulation 126 can protect the integrated circuit 58 as well as the bumps 110 from moisture, dust and other contaminants. In some embodiments, the molding compound 126 may be optional leaving the bumps 110 as well as the lower surface of the integrated circuit device 58 substantially open or exposed to the elements. In other embodiments, the integrated circuit device 58 can be attached to the upper surface 142 of the substrate 106 via an adhesive material.

In addition, interconnect structures 170 can be formed on the substrate 106 to function as conductive signal connectors. In some embodiments, the interconnect structures 170 can be solder balls, solder bumps, stud bumps, conductive pillars or other conductive structures. In other embodiments, the interconnect structures 170 can be solder balls having chemical compositions including without limitation tin, lead, silver, copper and nickel, or combinations thereof.

In one embodiment, the interconnect structures 170 and the integrated circuit device 58 can be formed on the substrate 106 adjacent each other. As shown, the interconnect structures 170 can be formed on both sides of the integrated circuit device 58 although it is possible that the interconnect structures 170 can be formed on only one side of the integrated circuit device 58 or can be otherwise configured per design specifications. The integrated circuit device 58 can be formed on the substrate 106 before or after the formation of the interconnect structures 170. In the alternative, the integrated circuit device 58 can be formed concomitant (concurrently or at the same time) as the formation of the interconnect structures 170. The integrated circuit device 58 can be a flip chip, a wire-bond chip or other suitable semiconductor device. In some embodiments, other types of integrated circuit devices 58 including logic, memory, passives, among others, can also be included.

In one embodiment, the interconnect structures 170 can include a core material 140 surrounded by an outer layer 145. In this embodiment, the interconnect structure 170 may include a core material 140 having a conductive copper or non-conductive polymeric material surrounded by an outer layer 145 of solder material, where the overall structure 140, 145 is capable of providing better solder joint-ability, wettability, solderability, among other benefits. In one embodiment, the interconnectstructure 170 may include a core material 140 made of metal copper with a diameter of from about 100 to about 300 microns, and the outer layer 145 may include a thin nickel material with a film thickness of from about 1 to about 4 microns. Optionally, the outer layer 145 may include a solder material with a film thickness of from about 10 to about 30 microns. Although bi-layer or tri-layer interconnect structures 170 are disclosed, single material interconnect structures 170 including the likes of solder balls or solder bumps may also be used.

In one embodiment, a plurality of external interconnects 112 can be formed on the lower surface 152 of the substrate 106. The external interconnects 112 can be in electrical communication with the integrated circuit device 58 through signal lines (not shown) in the substrate 106. The external interconnects 112 can also be in electrical communication with the integrated circuit device 58 through other suitable features including the likes of through-silicon vias (not shown), among others. The external interconnects 112 can also be in electrical communication with other features of the package 300 and will become more apparent in subsequent figures and discussion. The external interconnects 112 can be formed in similar manner and with similar material as that of the interconnect structures 170. In one embodiment, the external interconnects 112 can be solder bumps formed on the lower surface 152 of the substrate 106 opposite the integrated circuit device 58 and the interconnect structures 170.

In one embodiment, the integrated circuit device 58 and portions of the interconnect structures 170 can be covered with an encapsulation material 136, the encapsulation material 136 being similar to the encapsulation 126. An upper portion 190 of the interconnect structures 170 may be exposed for subsequent processing. The encapsulation material 136 can be formed using film-assisted molding, epoxy molding, moldable underfill or other suitable molding process. Additional details on the film-assisted molding process are disclosed in U.S. Pat. No. 8,035,235 granted Oct. 11, 2011 and filed as U.S. patent application Ser. No. 12/560, 312 on Sep. 15, 2009, which is hereby incorporated by reference in its entirety for all purposes.

In using film-assisted molding, because of the height difference between the upper portion 190 of the interconnect structures 170 and the upper surface of the integrated circuit die 58, only the interconnect structures 170 are physically engaged to a mold chase having a film. Once in physical contact, the voids or spaces created between the film/mold chase and the interconnect structures 170 can be filled or molded with an encapsulation material 136 similar to that of the encapsulation 126. And although shown as two distinct layers 126, 136, it is also possible to integrate the encapsulation 126 and the encapsulation material 136 as a single layer in other words, the earlier encapsulation 126 can be eliminated and the entire package 300 can be covered or encapsulated with the encapsulation material 136 during this subsequent step. In other embodiments, the encapsulation material 136 may be solder resist or dielectric material formed by deposition, lithography and etching, among other suitable techniques.

In one embodiment, if the interconnect structure 170 includes a core material 140 and an outer layer 145, where the core material 140 is metal copper ball with nickel plating, and the outer layer 145 is solder plated material, the core material 140 may be exposed after the film-assisted molding process. This may occur as a result of the interactions between the interconnect structure 170 and the encapsulation material 136 as well as the film used in the mold chase during the film-assisted molding process. In other words, the upper portion 190 of the interconnect structure 170 may be the core material 140. In another embodiment, the core material 140 may not be exposed during the film-assisted molding process and the upper surface 190 of the interconnect structure 170 may be the outer layer 145.

FIG. 5 includes a top-down view of the next step in the manufacturing process of the semiconductor package 300 with a cross-sectional view through A-A of the semiconductor package 300. In one embodiment, the upper portions 190 of the interconnect structures 170A, 170B, 170C, 170D may be treated with a deflashing process for cleaning purposes, among other reasons, while other interconnect structures 170E, 170F may not be subject to a deflashing process. In other words, the deflashing process can be selective. The deflashing process includes solder deflash as well as laser deflash, among other suitable deflashing techniques. In one embodiment, the deflashing process can take place on the solder or outer layer 145 of the selected interconnect structures 170A, 170B, 170C, 170D. In another embodiment, the deflashing process can take place on the metal core material 140 of the selected interconnect structures 170A, 170B, 170C, 170D. In some embodiments, the interconnect structures 170 need not be selectively deflashed but instead all the interconnect structures 170 can be subjected to a deflashing process.

FIG. 6 includes a top-down view of the next step in the manufacturing process of the semiconductor package 300 with a cross-sectional view through A-A of the semiconductor package 300. In one embodiment, a conductive material 160 may be formed over the upper portion 190 of the interconnect structures 170 as well as the encapsulation material 136. The conductive material 160 formed over the encapsulation material 136 may extend over and into the areas above the integrated circuit device 58 as best illustrated in the top-down view.

In some embodiments, the conductive material 160 can be formed by a direct writing process including the likes of screen printing or electro-hydro dynamic (EHD) dispensing. Screen printing involves the use of a paste material, screen mesh, an emulsion material and application of force via an applicator with the substrate held by a nest. In the alternative, EHD dispensing involves the use of an electric field to dispense droplets from a nozzle. In other embodiments, formation of the conductive material 160 can include the likes of inkjet printing, which can be continuous or on demand, and can be carried out in vertical or horizontal fashion. The use of inkjet printing to form the conductive material 160 may provide visible and conductive metal lines that are halogen free. The ink material that is involved may be of an organic metal or a silver complex.

With inkjet printing, an inkjet head may be provided over the desired area of interest. In this instance, over the upper portions 190 of the interconnect structures 170 as well as the trace lines (e.g., lines connecting interconnect structures 170). The inkjet head can deliver a resolution of 1,200 dots per inch (DPI) although other inkjet heads with other resolution may be utilized. Upon passing over the desired area, a nozzle from the inkjet head may cause an inkjet droplet to be deposited onto the upper portions 190 of the interconnect structures 170 as well as the trace lines. The inkjet droplet, containing the ink material, will subsequently be formed into the desired conductive material layer 160. In this example, the deposition can be accomplished via gravity. In other instances, the deposition can be carried out via other suitable mechanical and/or electrical assistance including the likes of an electric field, for example.

The number of nozzles on the inkjet head can vary. For example, there can be a total of 2,048 nozzles providing coverage width of about 43 millimeters. The nozzles and the head may have a writing speed of about 200 millimeters per second. The number of droplets can be varied depending on the desired thickness and/or width of the conductive material 160 to be achieved. For example, the number of droplets can vary between about 1 droplet to about 10 droplets, or greater than 10 droplets. The inkjet droplet may have a diameter of anywhere from about 3 microns to about 12 microns depending on the viscosity and the volume of the ink being consumed. Meanwhile, the thickness of the conductive material 160 formed may be about 3 microns thick, or thinner than 3 microns, or thicker than 3 microns. In this instance, the amount of ink can be about 1 picoliter. Because of the plurality of nozzles and the speed at which the head can process a substrate, inkjet printing throughput can be on the matter of seconds per strip of devices.

In one embodiment, the inkjet droplet may be a conductive material 160 in ink or liquid form. The types of conductive material 160 that can be in liquid or ink form include silver (Ag), platinum (Pt), gold (Au), copper (Cu), carbon nanotube (CNT), graphene, organic metal, or mixtures thereof. In another embodiment, the inkjet droplet that ultimately forms the conductive layer 160 may be a conductive polymeric material with metallic properties.

In another embodiment, instead of using inkjet printing and inkjet droplet, conductive material 160 may be deposited in paste form and that deposition can be made by screen printing or EHD dispensing. The paste may have material properties similar to the inkjet droplet disclosed above including without limitation silver (Ag) paste, platinum (Pt) paste, gold (Au) paste or copper (Cu) paste, to name a few.

In one embodiment, prior to the deposition of the inkjet droplet, the upper portions 190 of the interconnect structures 170, as well as the trace lines, may be treated with hydrophilic plasma. Treating the upper portions 190 of the interconnect structures 170 as well as the trace lines with hydrophilic plasma may raise the surface energy of the upper portions 190 of the interconnect structures 170 and the trace lines leading to increased dispersion of the conductive ink.

The inkjet droplet, once sitting on the upper portions 190 of the interconnect structures 170 and the trace lines, can be allowed to disperse and spread out. Because of the low viscosity (<100 centipoise), the inkjet droplet is able to spread out to cover the desired surface area. For example, the inkjet droplet may have an initial area upon deposition. In one example, the initial area may be in the range of from about 10-15 microns (e.g., diameter of the droplet). In time, the inkjet droplet may disperse or be allowed to disperse thereby arriving at a final area. In one embodiment, the final area is greater than the initial area. The final area may be substantially similar to the opening of the upper portion 190 of the interconnect structure 170. For example, the interconnect structure 170 may have a width of about 250 microns, with 200 microns being the final area or width (e.g., exposed upper portion 190) that the inkjet droplet may disperse. In other words, the initial area may be about 15 microns while the final area may be about 200 microns. The dispersion of more than 10-fold can be accomplished because of the low viscosity of the inkjet droplet. The dispersion may be further enhanced if the upper portions 190 of the interconnect structures 170 and the trace lines had been subjected to the hydrophilic plasma process as discussed above, which helps to raise the surface energy and enhance the dispersion process.

In operation, formation of the conductive material 160 over the upper portion 190 of the interconnect structure 170 includes depositing the conductive material 160, and optionally allowing the conductive material 160 to disperse from an initial area to a final area. As indicated above, the final area can be greater than the initial area. Next, heating or curing the conductive material 160 into a solid form. If screen printing or EHD dispensing is utilized, the conductive liquid or paste may be deposited having a first material state, where the first material state includes liquid, viscous or paste form. The conductive liquid or paste need not go through the dispersion or spreading process and a desired profile of the conductive material 160 may be formed after the deposition step. Next, the conductive material 160 can be heated from the first material state to a second material state, where the second material state is different from the first material state. The second material state may include solid, crystal or sintered form.

In some embodiments, after deposition and/or dispersion of the conductive material 160, a heating process may be carried out to further sinter the material. In one embodiment, the heating process may include oven or ultra-violet curing or both. The heating process may also include a reflow process for purposes of sintering the conductive particles that are in the conductive ink or paste material 160. In other embodiments, the first state may have an initial profile while the second state may have a final profile where the final profile is different from the initial profile. The difference in the profile may be a result of the heating or curing process which may drive out the fluid or viscous material in the liquid or paste causing the conductive material to undergo shrinkage into a more solid or sintered form. The conductive ink, paste or liquid used in the formation of the conductive material 160 may include silver (Ag) complexes, platinum (Pt) complexes, gold (Au) complexes, copper (Cu) complexes, carbon nanotube (CNT), graphene, organic metal, or additives and mixtures thereof. The conductive ink, paste or liquid may also be an organic polymer with metallic properties.

In short, the conductive material 160 can be formed without a lithographic process involving the coating and removal of a photoresist material. Furthermore, the conductive material 160 can be formed without the use of a traditional metallization process in which the material is deposited and formed as is.

Figure 7:
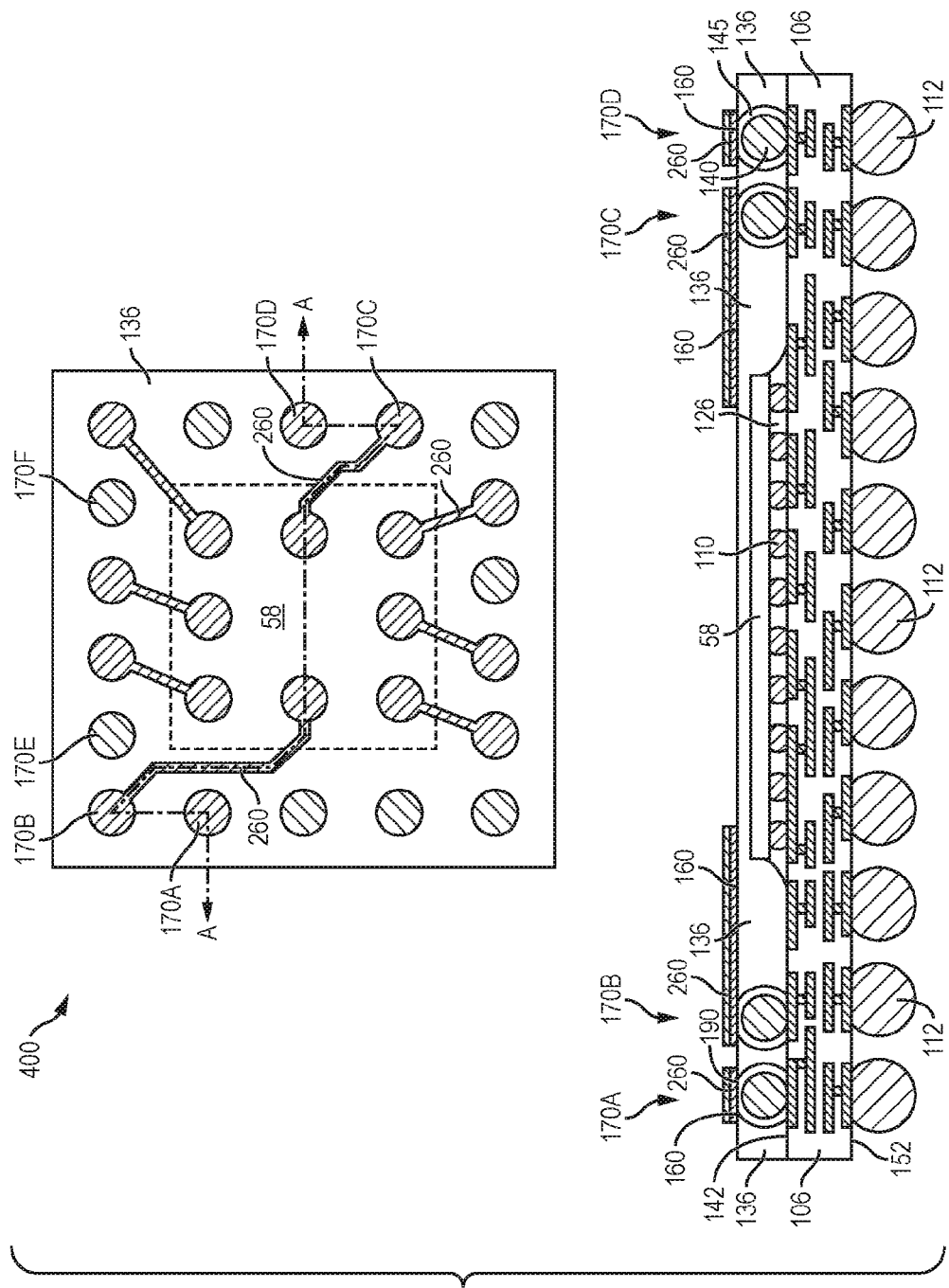
FIG. 7 includes top-down and cross-sectional views of a semiconductor package according to one embodiment.

FIG. 7 includes top-down view of a semiconductor package 400 with a cross-sectional view through A-A of the semiconductor package 400, which can be continued from the semiconductor package 300 of FIG. 6 with additional processing steps. In one embodiment, a second conductive material 260 can be formed over the first conductive material 160, where the second conductive material 260 and the first conductive material 160 have substantially similar geometric footprint. In this embodiment, the geometric layout of the second conductive layer 260 can follow those of the first conductive layer 160 as seen from the top-view as well as the cross-sectional view.

In one embodiment, the first conductive material 160 can serve as a seed layer while the second conductive material 260 can be the conductive pattern to provide the conductive trace lines along with full area array top ball pads. The seed layer 160 may be formed as a conductive ink or paste by direct writing including without limitation inkjet printing, screen printing or EHD dispensing, the formation being carried out without the use of photolithography and/or removal of photoresist. Further, the formation can be carried out without any etching of the conductive material 160. In some embodiments, the second conductive material 260 can be formed by electroplating or electro-less plating. In other embodiments, the second conductive material 260 can be formed by the printing processes described above similar to those for the first conductive material 160.

Figure 8:
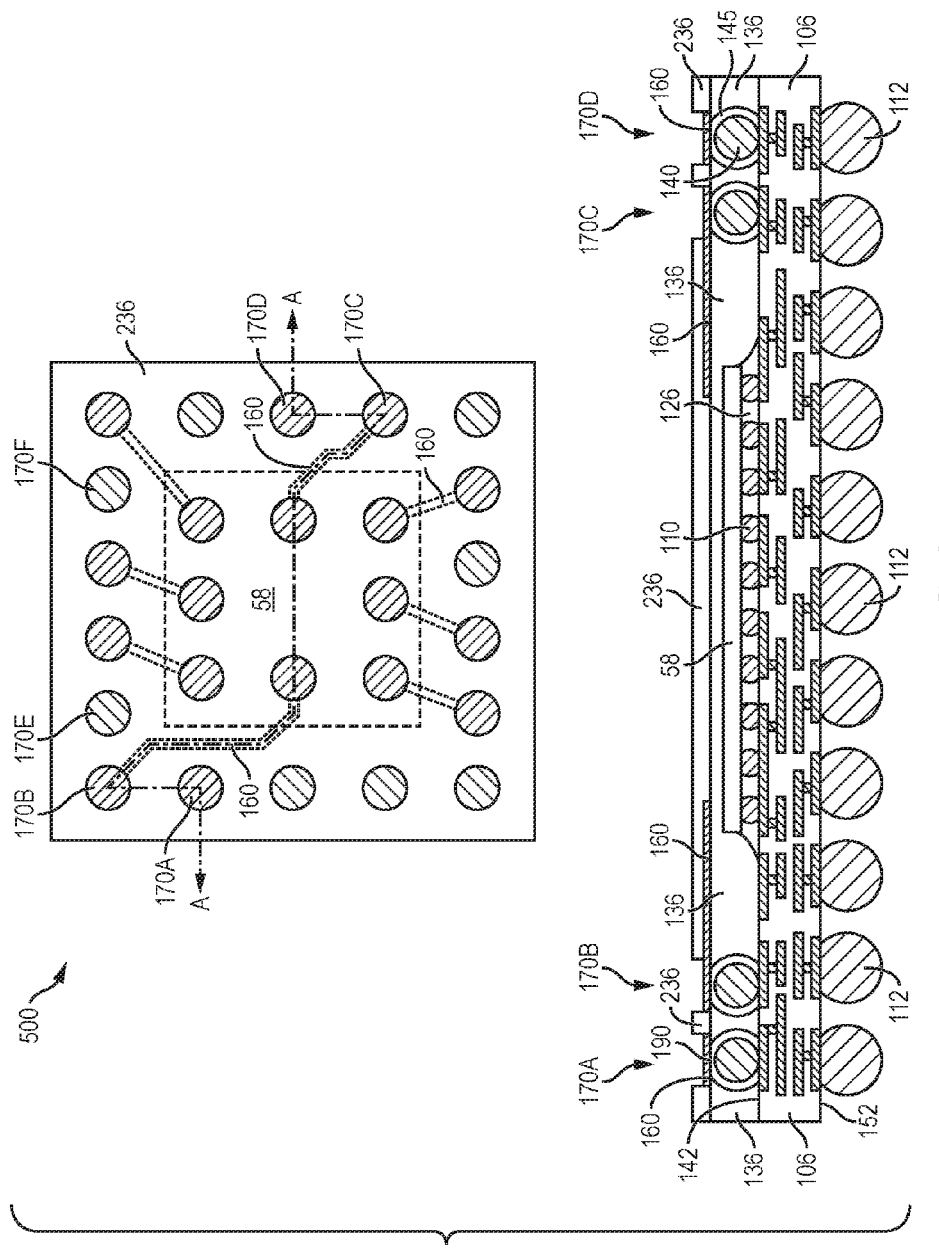
FIG. 8 includes top-down and cross-sectional views of a semiconductor package according to one embodiment.

FIG. 8 includes top-down view of a semiconductor package 500 with a cross-sectional view through A-A of the semiconductor package 500, which can be continued from the semiconductor package 300 of FIG. 6 with additional processing steps. In one embodiment, an isolating material 236 can be formed over the encapsulation material 136. In this instance, a first portion of the isolating material 236 can be formed over the conductive material 160 while a second portion of the isolating material 236 can be formed in between and adjacent the conductive material 160. In general, the first portion of the isolating material 236 formed over the conductive material 160 are more directed to the trace lines, e.g., the conductive lines coupling the interconnect structures 170 to the top pads over the integrated circuit device 58. The second portion of the isolating material 236 formed in between and adjacent the conductive material 160 are those adjacent and in between the interconnect structures 170 about the peripheral of the package 500. This is best illustrated on the two peripheral sides of the cross-sectional view.

In one embodiment, the isolating material 236 includes at least one of dielectric ink, dielectric paste, thermosetting resin, and mixtures thereof. In some embodiments, the isolating material 236 can be formed with similar techniques as those above for the conductive material 160. For example, the isolating material 236 can be initially deposited, optionally be allowed to disperse or spread, and subsequently heated to form the desired structure and final profile. In other embodiments, the isolating material 236 can be solder mask material formed by photolithography or direct writing with dielectric ink. Although shown to be formed over only one conductive layer 160, the package 400 of FIG. 7 can be combined with the current package 500 such that the isolating material 236 can be formed over the encapsulation material 136 where a portion is over both conductive materials 160, 260 while another portion is in between and adjacent to. In some examples, the isolating material 236, formed of the isolating material in ink, paste, or liquid form, can be conformally formed over the structures underneath. In other words, the isolating material 236 can follow the shape or contour of the conductive layers 160, 260 including any angles and crevices thereof, and fill in any of such openings or recesses as necessary in forming the isolating layer 236.

Figure 9:
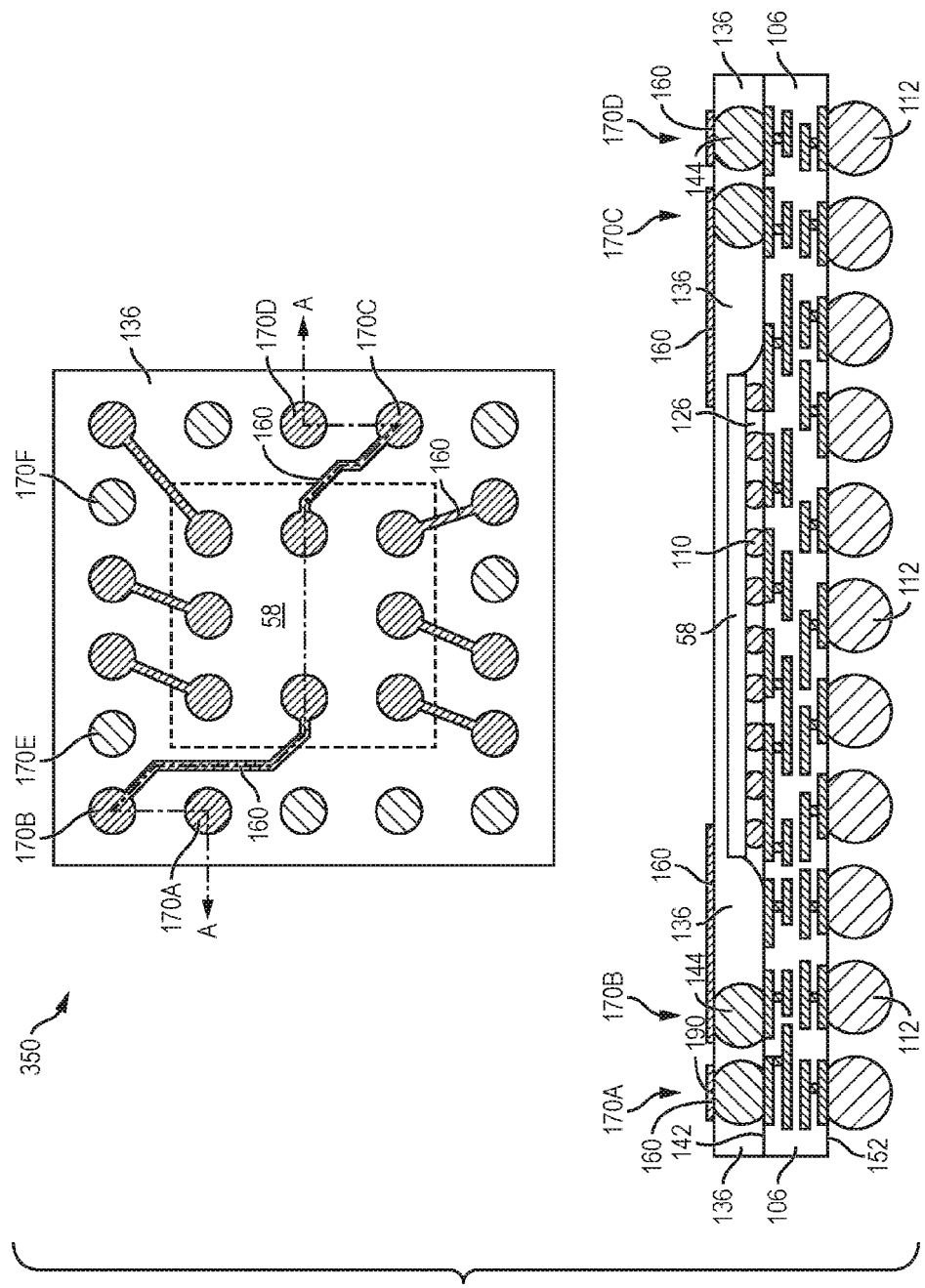
FIG. 9 includes top-down and cross-sectional views of the package of FIG. 6 with a different interconnect structure.

FIG. 9 includes top-down view of a semiconductor package 350 with a cross-sectional view through A-A of the semiconductor package 350, which is in essence substantially similar to the semiconductor package 300 of FIG. 6 with the exception that the interconnect structure 170 includes a single layer 144. In this package 350, the interconnect structure 170 is a standard solder ball with only a single core layer 144. There is no outer layer in this example. The interconnect structure 170 can be formed by traditional solder ball formation techniques. Furthermore, the interconnect structure 170 can be implemented in other packages 400, 500 as well.

Figure 10:
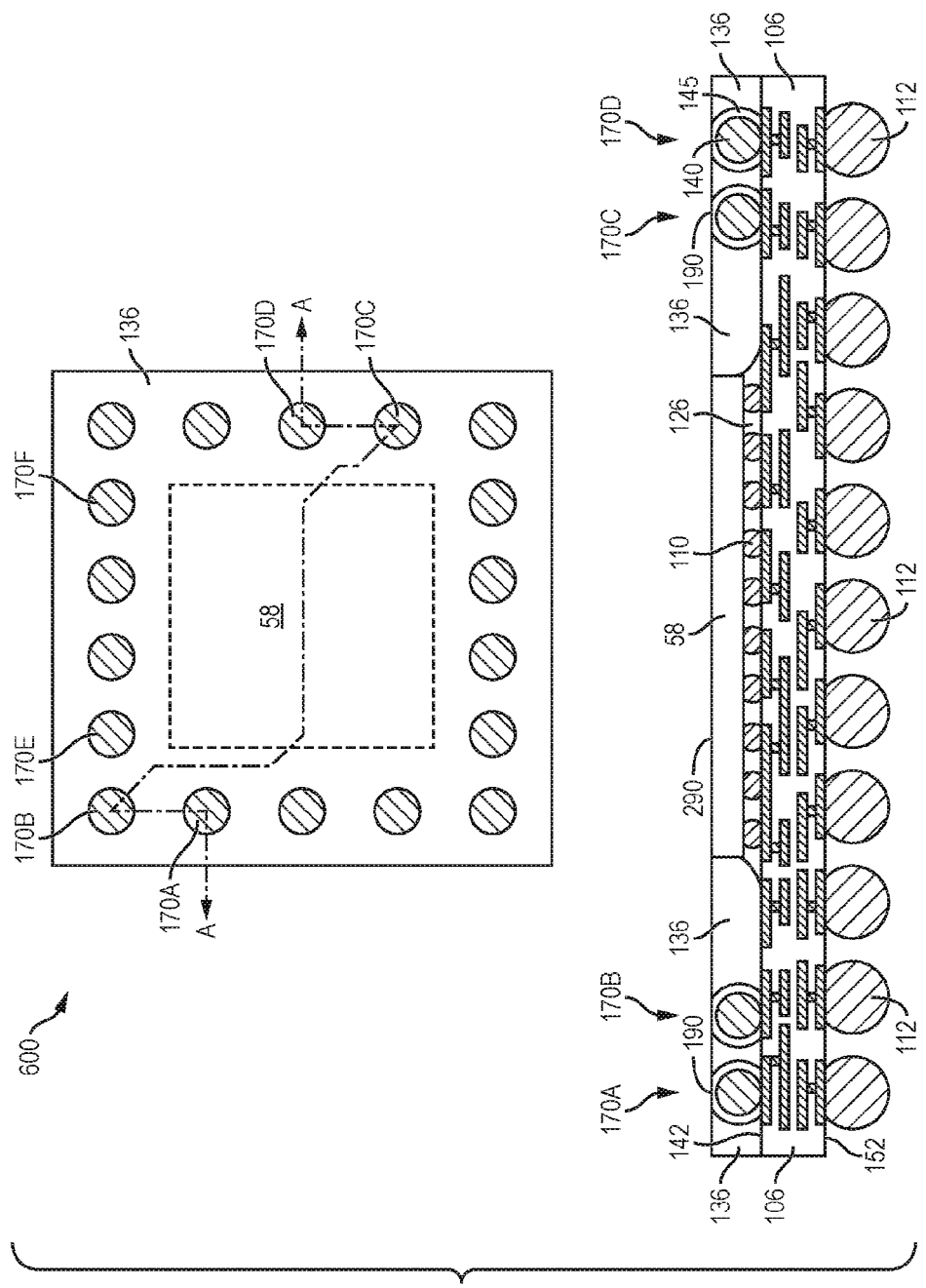
FIGS. 10-13 are top-down and cross-sectional views of a method of forming conductive and insulating layers on a semiconductor package according to one embodiment.

FIGS. 10-13 are top-down and cross-sectional views of a method of forming conductive and insulating layers on a semiconductor package 600 according to one embodiment of the present disclosure. FIG. 10 includes a top-down view of the semiconductor package 600 with a cross-sectional view through A-A of the semiconductor package 600. As shown, the package 600 includes a substrate 106 having an upper surface 142 and a lower surface 152 similar to that discussed above. An integrated circuit device 58 can be mounted over the upper surface 142 of the substrate 106 via a plurality of internal connectors 110 and encapsulated with a molding compound 126. A plurality of interconnect structures 170 can be formed over the upper surface 142 of the substrate 106 as well with the interconnect structures 170 being adjacent the integrated circuit device 58.

In one embodiment, an encapsulation material 136 can be used to cover a peripheral portion of the integrated circuit device 58 and a peripheral portion of the interconnect structures 170 using film-assisted molding similar to that discussed above. The peripheral portions are the sides of the integrated circuit device 58 and the interconnect structures 170 that are embedded within the encapsulation material 136. In this instance, the upper portions 190 of the interconnect structures 170 and the upper surface 290 of the integrated circuit device 58 may substantially co-planar such that during film-assisted molding of the encapsulation material 136 the upper surface 290 of the integrated circuit device 58 and the upper portions 190 of the interconnect structures 170 are exposed.

Figure 11:
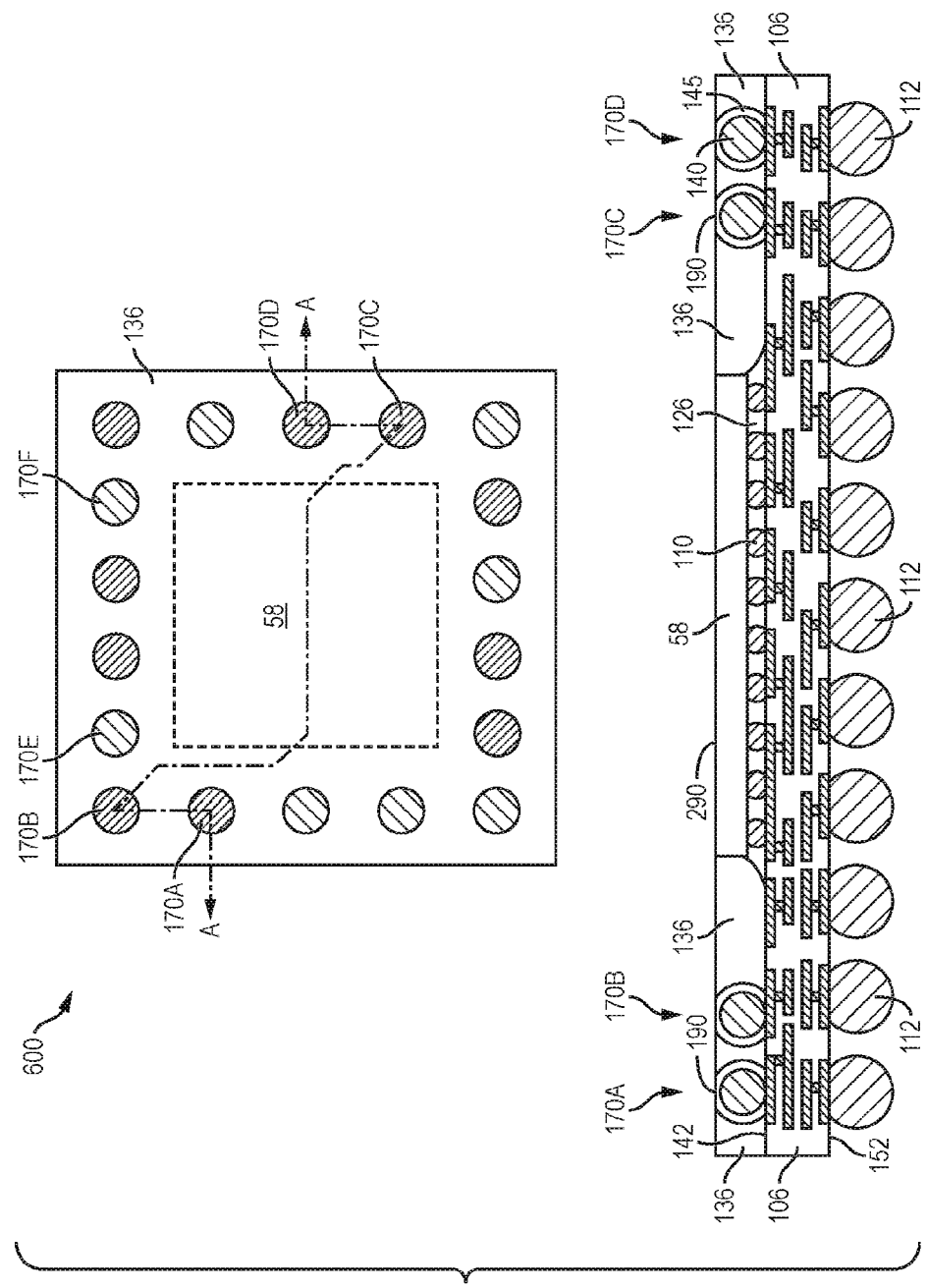
Figure 12:
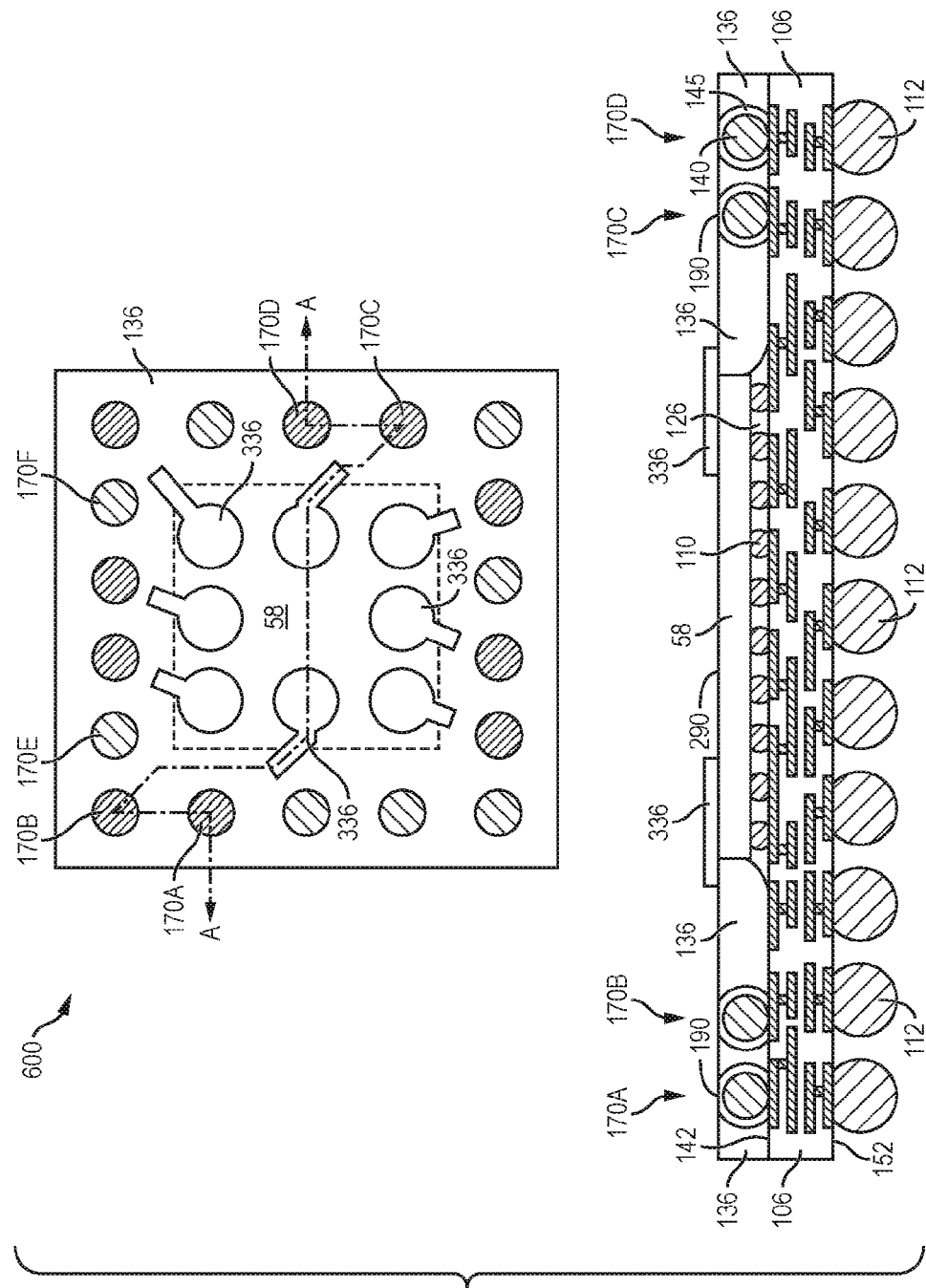

Next, as shown in FIG. 11, selected upper portions 190 of the interconnect structures 170A, 170B, 170C, 170D as well as the upper surface 290 of the integrated circuit device 58 may be treated with a deflashing process similar to that discussed above. The optional solder deflash or laser deflash may help to remove any mold resin residue that may be exposed onto the interconnect structures 170 during film-assisted molding of the encapsulation material 136. In one embodiment, as shown in FIG. 12, an insulating material 336 may be formed over the upper surface 290 of the integrated circuit device 58. In other embodiments, the insulating material 336 may be formed over other parts of the package 600 as necessary to serve as dielectric primer and prevent electrical shorting. The insulating material 336 may be formed with similar processes as the conductive materials 160, 260 described above. For example, the insulating material 336 can be formed by depositing the insulating material 336 having a first state, and heating the insulating material 336 from the first state to a second state, where the second state is different from the first state. Optionally, the insulating material 336 may be allowed to disperse or spread out similar to that described above. In some embodiments, the insulating material 336 may include at least one of dielectric ink, dielectric paste, thermosetting resin, and mixtures thereof.

In one embodiment, the insulating material 336 is a dielectric primer material that can be formed by direct writing including without limitation inkjet printing, screen printing or EHD dispensing with a dielectric ink. One of the purposes of the insulating material 336 is to prevent electrical short between the subsequently formed conductive layer 160 and the upper surface 290 of the integrated circuit device 58, which may be conductive.

Figure 13:
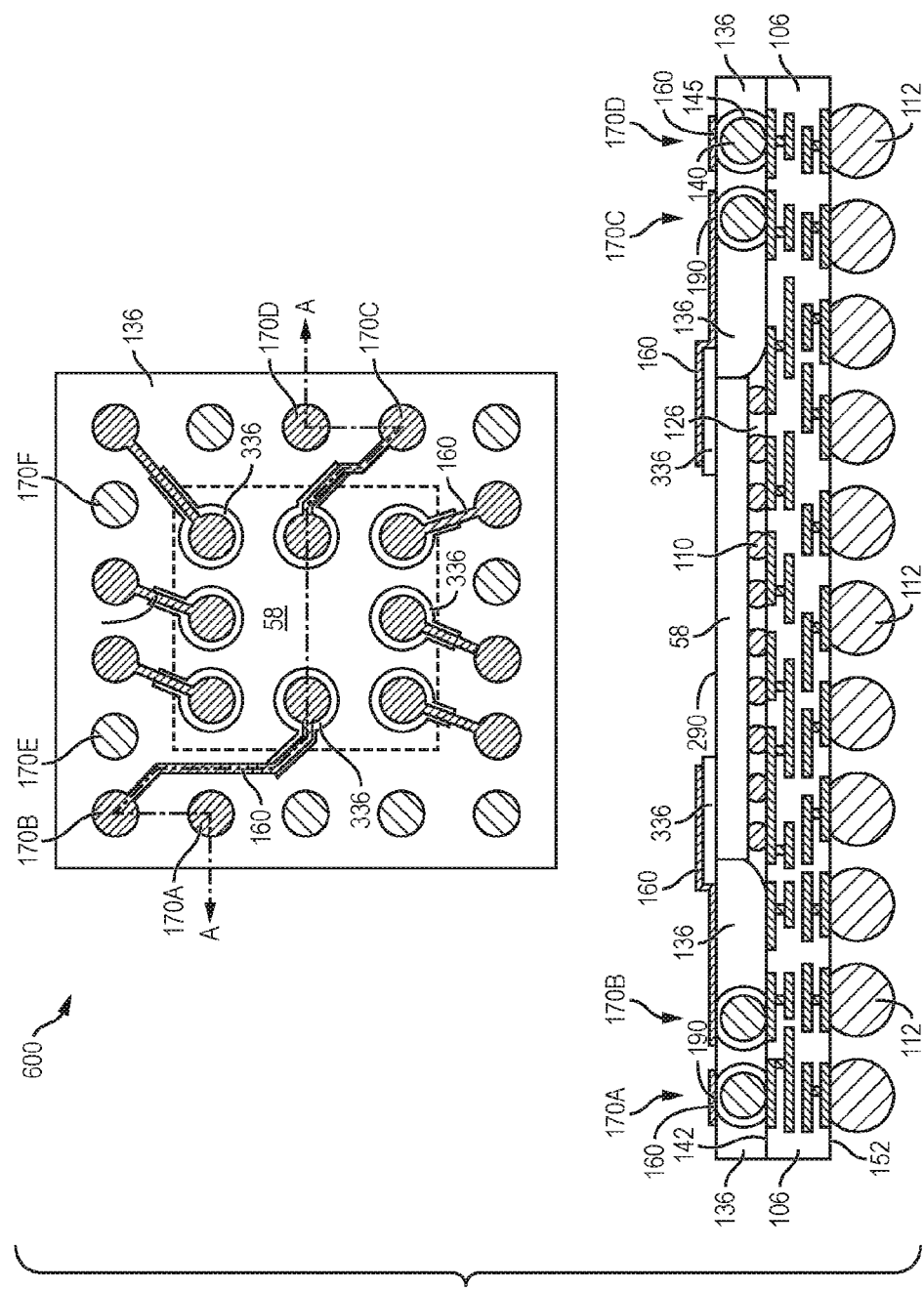

FIG. 13 includes a top-down view of the next step in the manufacturing process of the semiconductor package 600 with a cross-sectional view through A-A of the semiconductor package 600. In one embodiment, a conductive material 160 may be formed over the insulating material 336 extending from the upper surface 290 of the integrated circuit device 58 to the upper portions 190 of the interconnect structures 170. In some instances, the conductive material 160 may be formed over the upper portions 190 of the interconnect structures 170 similar to that discussed above. The conductive material 160 can be formed in a similar fashion as that discussed above including depositing the conductive material 160 having a third state, optionally allowing the conductive material 160 to disperse, followed by heating of the conductive material 160 from the third state to a fourth state, where the fourth state is different from the third state. The third state may be similar to the first material state above while the fourth state may be similar to the second material state above. The conductive material 160 may also have an initial profile and a final profile.

As shown, the conductive material 160 may be indented or slightly offset (e.g., some pullback) from the edges of the insulating material 336 over the upper surface 290 of the integrated circuit device 58 so as to further minimize risk of shorting. Further, as shown, the conductive material 160, formed of the conductive material in ink, paste, or liquid form, can conformally form over the structures underneath. In other words, the conductive material 160 can follow the shape or contour of the insulating material 336 including any angles and crevices thereof, and fill in any of such openings or recesses as necessary in forming the conductive layer 160. The conforming characteristics of the conductive material 160 may be further illustrated near the corner of the upper surface 290 of the integrated circuit device 58 where the conductive material 160 "steps down" from the insulating material 336 and makes contact with the encapsulation material 136.

Figure 14:
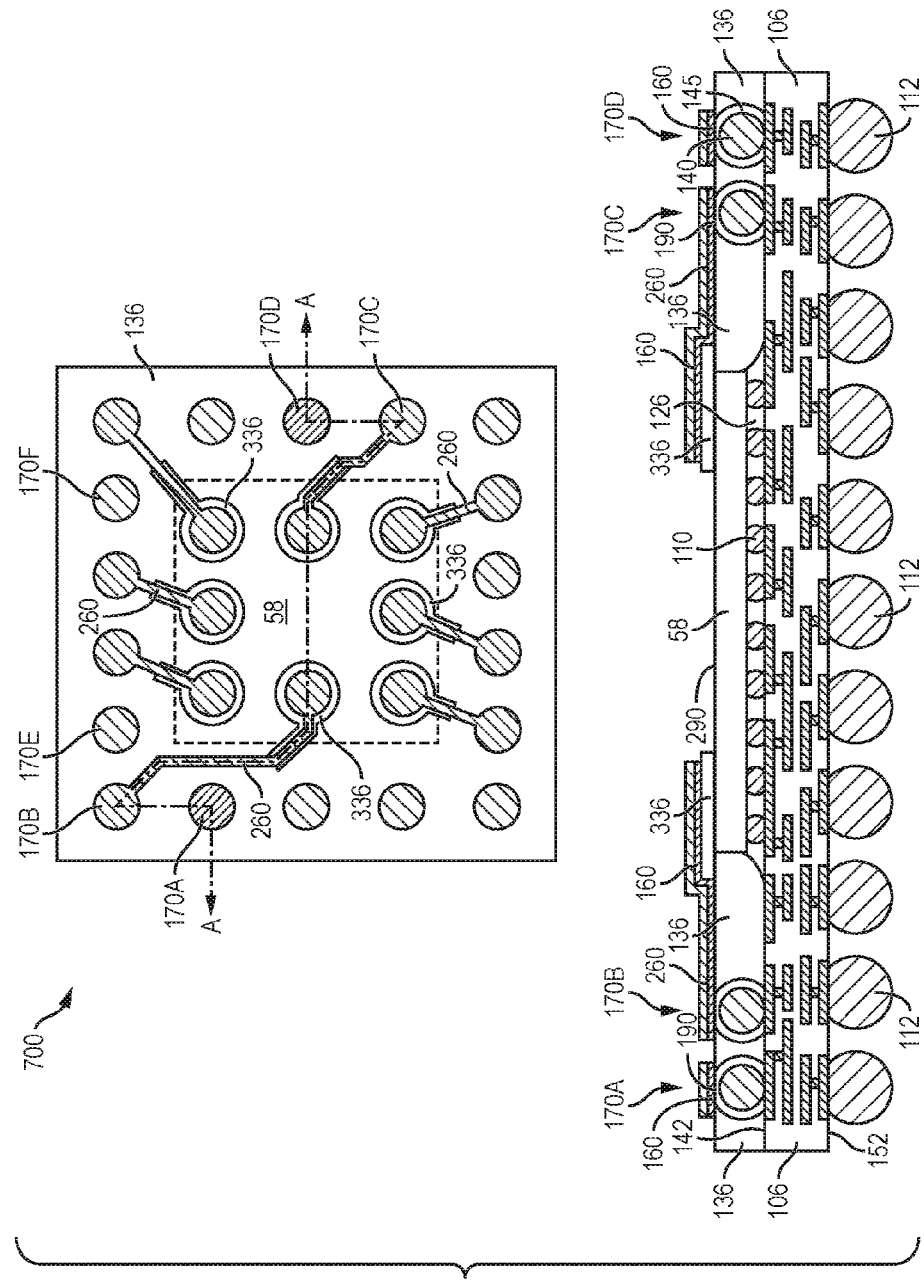
FIG. 14 includes top-down and cross-sectional views of a semiconductor package according to one embodiment.

FIG. 14 includes top-down view of a semiconductor package 700 with a cross-sectional view through A-A of the semiconductor package 700, which can be continued from the semiconductor package 600 of FIG. 13 with additional processing steps. In one embodiment, a second conductive material 260 can be formed over the first conductive material 160, where the second conductive material 260 and the first conductive material 160 have substantially similar geometric footprint. In this embodiment, the geometric layout of the second conductive layer 260 can follow those of the first conductive layer 160 as seen from the top-view as well as the cross-sectional view. And like the first conductive material 160, the second conductive material 260 can also conform to the contours and shapes of the first conductive material 160 underneath.

In one embodiment, the first conductive material 160 can serve as a seed layer while the second conductive material 260 can be the conductive pattern to provide the conductive trace lines along with full area array top ball pads. The seed layer 160 may be formed as a conductive ink or paste by direct writing including without limitation inkjet printing, screen printing or EHD dispensing, the formation being carried out without the use of photolithography and/or removal of photoresist. Further, the formation can be carried out without any etching of the conductive material 160. In some embodiments, the second conductive material 260 can be formed by electroplating or electro-less plating. In other embodiments, the second conductive material 260 can be formed by the printing processes described above similar to those for the first conductive material 160.

Figure 15:
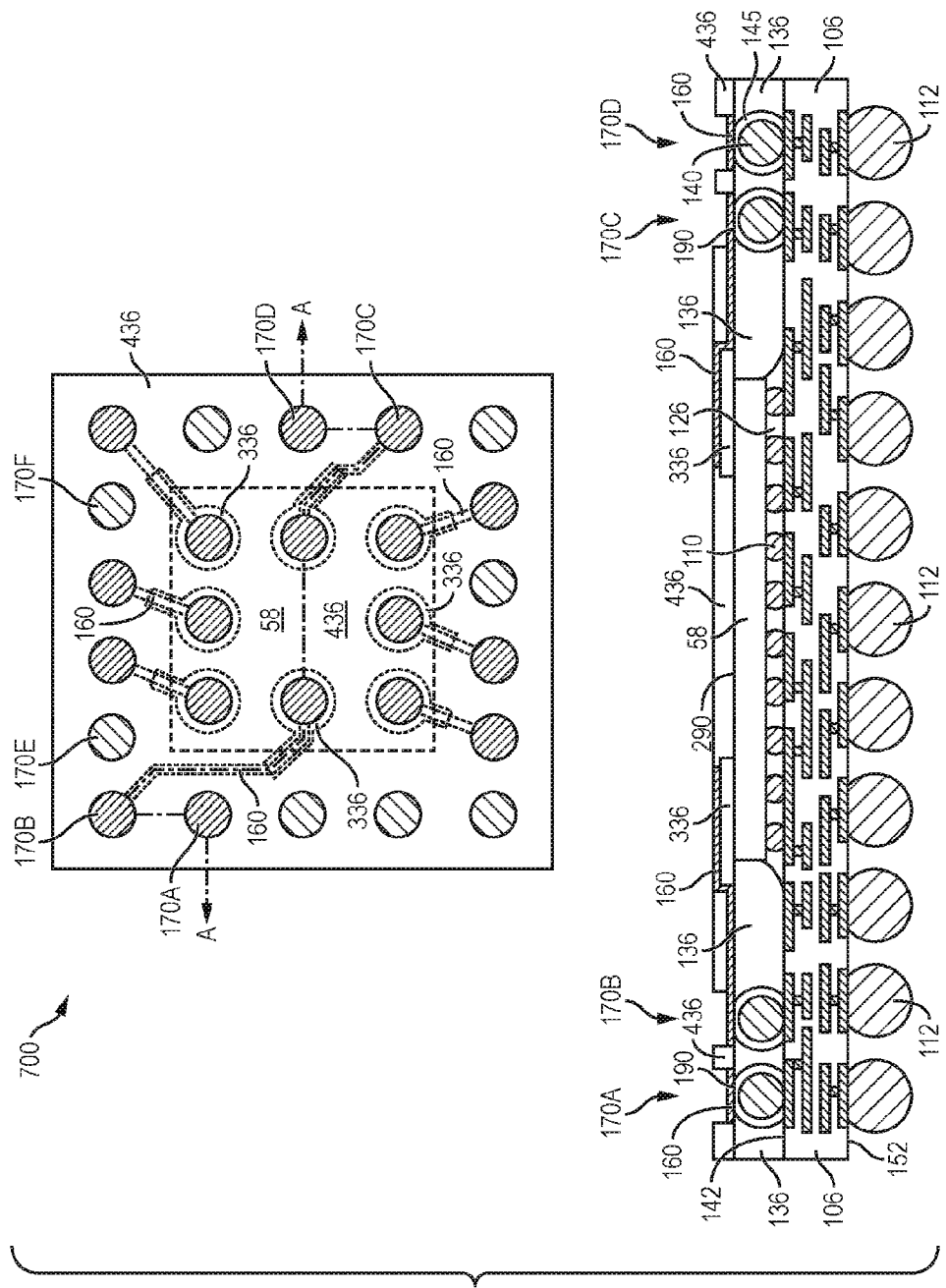
FIG. 15 includes top-down and cross-sectional views of a semiconductor package according to one embodiment.

FIG. 15 includes top-down view of a semiconductor package 800 with a cross-sectional view through A-A of the semiconductor package 800, which can be continued from the semiconductor package 600 of FIG. 13 with additional processing steps. In one embodiment, an isolating material 436 can be formed over the upper surface 290 of the integrated circuit device 58. In this instance, a first portion of the isolating material 436 can be formed over the conductive material 160 while a second portion of the isolating material 436 can be formed in between and adjacent the conductive material 160. In general, the first portion of the isolating material 436 formed over the conductive material 160 are more directed to the trace lines, e.g., the conductive lines coupling the interconnect structures 170 to the insulating material 336 over the integrated circuit device 58. The second portion of the isolating material 436 formed in between and adjacent the conductive material 160 are those adjacent and in between the interconnect structures 170 about the peripheral of the package 800. This is best illustrated on the two peripheral sides of the cross-sectional view.

In one embodiment, the isolating material 436 may be similar to that of the insulating material 336 including at least one of dielectric ink, dielectric paste, thermosetting resin, and mixtures thereof. In some embodiments, the isolating material 436 can be formed with similar techniques as those above for the conductive material 160 or the insulating material 336. For example, the isolating material 436 can be initially deposited, optionally be allowed to disperse or spread, and subsequently heated to form the desired structure and final profile. In other embodiments, the isolating material 436 can be solder mask material formed by photolithography or direct writing with dielectric ink. In one embodiment, the package 700 of FIG. 14 can be combined with the current package 500 such that the isolating material 436 can be formed over the upper surface 290 of the integrated circuit device 58 where a portion is over two conductive layers 160, 260 while another portion is in between and adjacent to. In some examples, the isolating material 436, formed of the isolating material in ink, paste, or liquid form, can be conformally formed over the structures underneath. In other words, the isolating material 436 can follow the shape or contour of the conductive layers 160, 260 including any angles and crevices thereof, and fill in any of such openings or recesses as necessary in forming the isolating layer 436.

Figure 16:
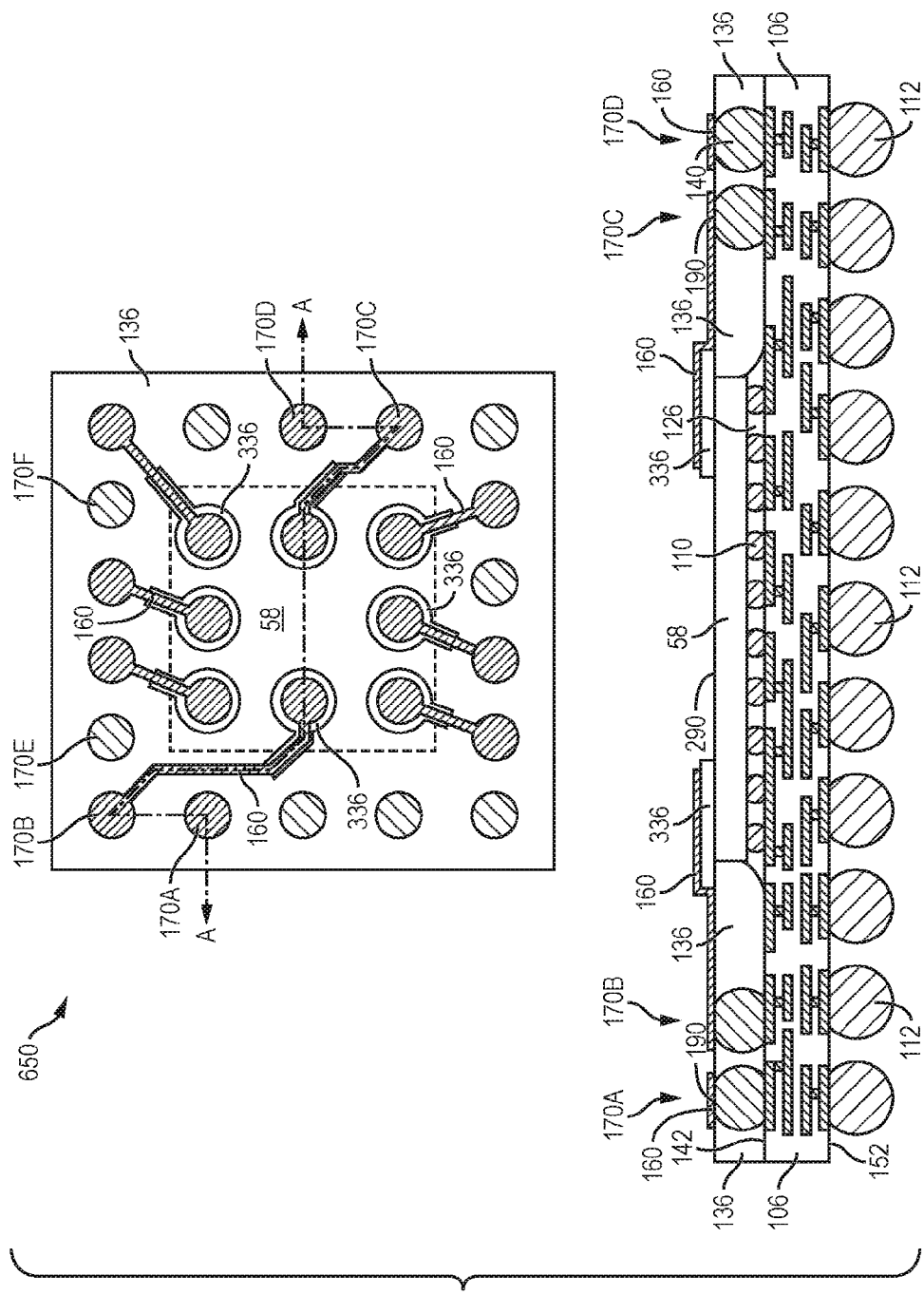
FIG. 16 includes top-down and cross-sectional views of the package of FIG. 13 with a different interconnect structure.

FIG. 16 includes top-down view of a semiconductor package 650 with a cross-sectional view through A-A of the semiconductor package 650, which is in essence substantially similar to the semiconductor package 600 of FIG. 13 with the exception that the interconnect structure 170 includes a single layer 144. In this package 650, the interconnect structure 170 is a standard solder ball with only a single core layer 144. There is no outer layer in this example. The interconnect structure 170 can be formed by traditional solder ball formation techniques. Furthermore, the interconnect structure 170 can be implemented in other packages 700, 800 as well.

Figure 17:
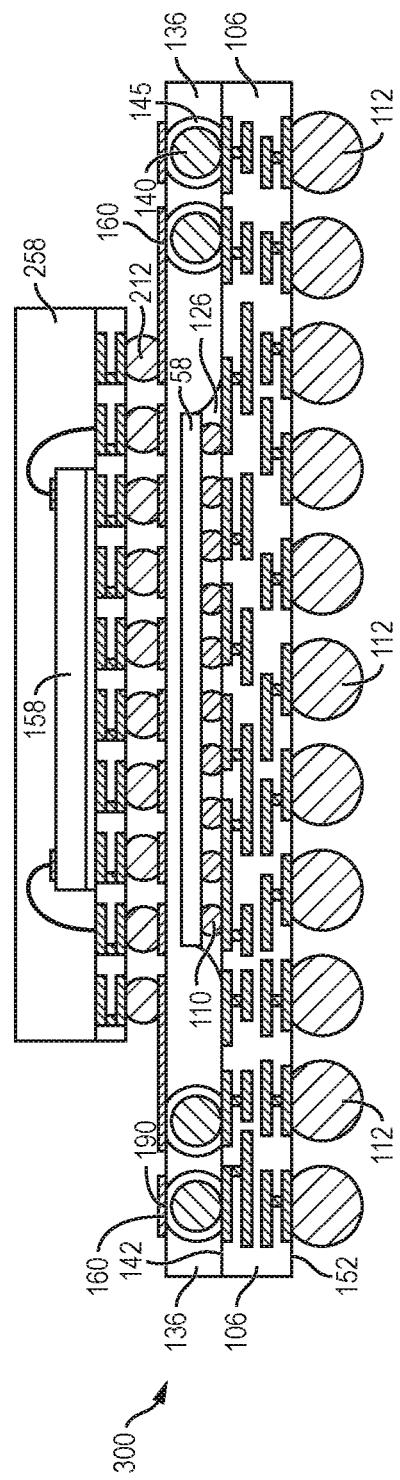
FIG. 17 is a cross-sectional view of a semiconductor package according to one embodiment.

FIG. 17 is a cross-sectional view of a semiconductor package according to another embodiment of the present disclosure. As shown, a semiconductor package 258 having an integrated circuit device 158 therein can be mounted over an existing semiconductor package 300. In this instance, the semiconductor package 300 is that of FIG. 6. The semiconductor package 258 can be mounted over the conductive layer 160 of the semiconductor package 300 via a plurality of internal interconnects 212. The internal interconnects 212 may be similar to those of the internal interconnects 110 described above. Once the package-on-package (PoP) structure has been formed, both the integrated circuit devices 58, 158 may be in electrical communication with the external interconnects 112. For example, the integrated circuit device 58 may be in communication with the external interconnects 112 through signal lines within the substrate 106. Meanwhile, the integrated circuit device 158 may be in communication with the external interconnects 112 through the internal interconnects 212 as well as the conductive layer 160. Although only the package 300 of FIG. 6 is shown, it will be understood that the upper semiconductor package 258 can be mounted over each of the various packages 350, 400, 500, 600, 650, 700, 800 disclosed in all the figures of the current disclosure.

Figure 18:
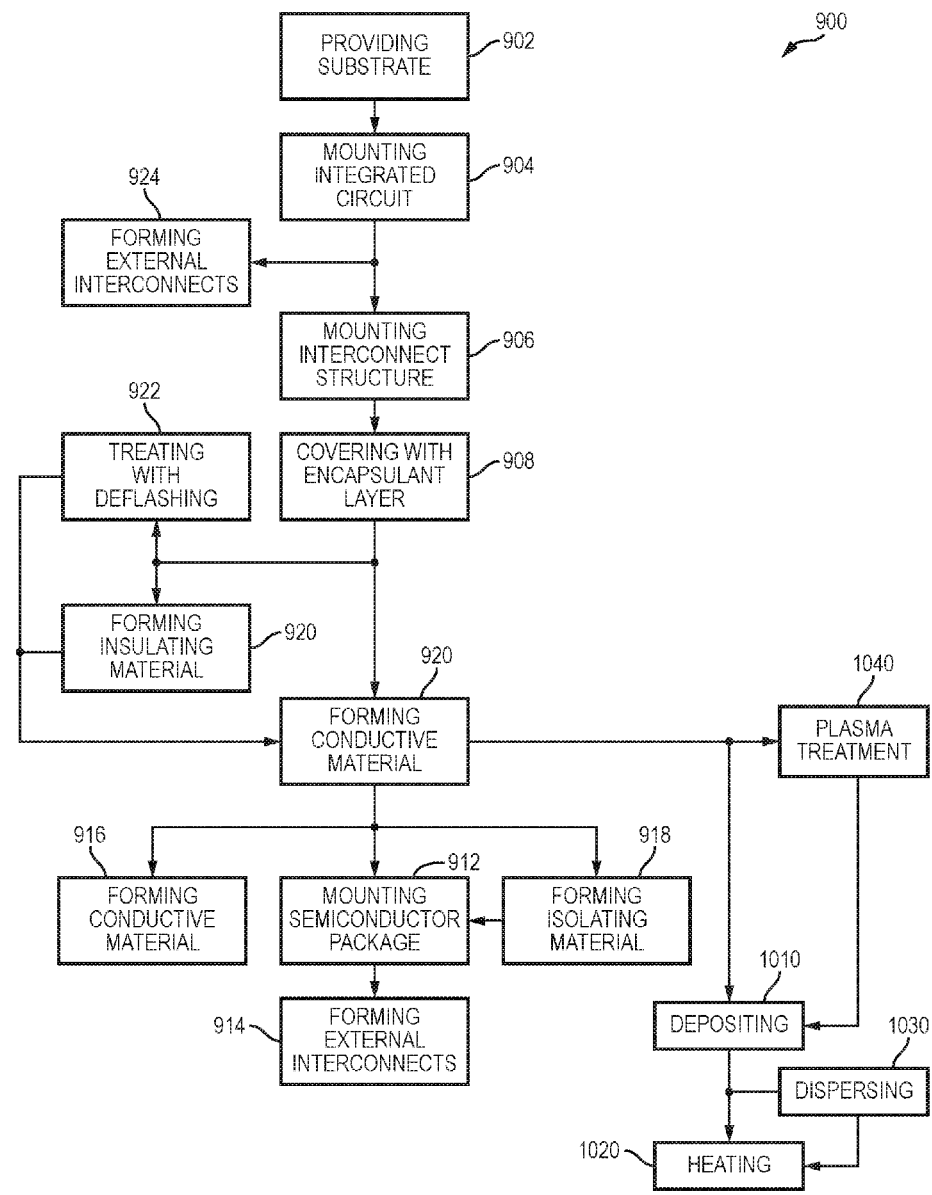
FIG. 18 is a flow diagram of the methods of forming conductive and insulating layers on semiconductor devices and packages.

FIG. 18 is a flow diagram 900 of the methods of forming conductive and insulating layers for semiconductor devices and packages. In one embodiment, a method of forming conductive and insulating layers for semiconductor packages includes providing a substrate having an upper surface and a lower surface, where the lower surface is opposite the upper surface as indicated in step 902. Next, a first integrated circuit device can be mounted over the upper surface of the substrate in step 904. Next, an interconnect structure can be mounted over the upper surface of the substrate, where the interconnect structure is adjacent the first integrated circuit device in step 906. Although the interconnect structure is mounted after the integrated circuit device, the steps 904, 906 may be reversed where the interconnect structure is mounted before the integrated circuit device. Next, the first integrated circuit device and portions of the interconnect structure can be covered with an encapsulation material in step 908. The covering step 908 does leave an upper portion of the interconnect structure exposed.

A first conductive material can be formed over the upper portion of the interconnect structure and the encapsulation material in step 910. The forming step can include the following sub-steps: (i) depositing the first conductive material having a first state in step 1010, where the first conductive material includes at least one of silver (Ag), platinum (Pt), gold (Au), copper (Cu), carbon nanotube (CNT), graphene, organic metal, and mixtures thereof. Next, the first conductive material can be heated from the first state to a second state, where the second state is different from the first state in step 1020. Optionally, the conductive material can disperse or be allowed to disperse in step 1030. In another embodiment, to enhance the dispersion step 1030, the upper portion of the interconnect structure can be treated with hydrophilic plasma in step 1040 prior to the forming steps 1010, 1020, 1030.

In one embodiment, the method further includes mounting a semiconductor package over the first conductive material in step 912. In this embodiment, the semiconductor package includes a second integrated circuit device. In another embodiment, the method further includes forming a plurality of external interconnects on the lower surface of the substrate in step 914. In this embodiment, the external interconnects is in communication with at least one of the first integrated circuit device and the second integrated circuit device. Although the formation of the external interconnects are disclosed in step 914, it is also possible that the external interconnects can be formed in step 924 during the mounting steps 904, 906.

In one embodiment, the method further includes treating the upper portion of the interconnect structure with a deflashing process in step 922 after the covering step 908 but before the forming step 910. In another embodiment, the method further includes forming a second conductive material over the first conductive material in step 916. In this embodiment, the second conductive material and the first conductive material can have substantially similar geometric footprint.

In one embodiment, a method of forming conductive and insulating layers for semiconductor packages can be substantially similar to that above including: providing a substrate in step 902, mounting a first integrated circuit device and an interconnect structure over the substrate in steps 906, 908. The first integrated circuit device and the interconnect structure can be covered with an encapsulation material in step 908 with a conductive material formed thereover in step 910. The conductive material can be formed with similar materials and processes as disclosed above and in steps

1010, 1020, 1030 and 1040. In one embodiment, the method further includes forming an isolating material over the encapsulation material in step 918. In this embodiment, a first portion of the isolating material can be formed over the conductive material while a second portion of the isolating material can be formed in between and adjacent the conductive material. If the process had been subjected to two conductive material deposition steps 910, 916, the isolating material can be formed over both conductive materials, as well as in between and adjacent thereto. In some embodiments, the isolating material includes at least one of dielectric ink, dielectric paste, thermosetting resin, and mixtures thereof.

Like above, a semiconductor package can be mounted over the conductive material in step 912, where the semiconductor package includes a second integrated circuit device, while a plurality of external interconnects can be formed on the lower surface of the substrate in step 914 for communicating with either the first integrated circuit device or the second integrated circuit device. The upper portion of the interconnect structure can be treated with a deflashing process in step 922, which is after the covering step 908 but before the forming step 910.

In one embodiment, a method of forming conductive and insulating layers for semiconductor packages can be substantially similar to that above including: providing a substrate in step 902, mounting a first integrated circuit device and an interconnect structure over the substrate in steps 906, 908. A peripheral portion of the first integrated circuit device and a peripheral portion of the interconnect structure can be covered with an encapsulation material in step 908. Doing so leaves an upper surface of the first integrated circuit device and an upper portion of the interconnect structure exposed. Next, an insulating material can be formed over the upper surface of the first integrated circuit device in step 920.

In one embodiment, the insulating material can be formed in similar fashion as that of the conductive material as disclosed above and in steps 1010, 1020, 1030 and 1040. For example, the forming step 920 can include the following sub-steps: (i) depositing the insulating material having a first state in step 1010, where the insulating material includes at least one of dielectric ink, dielectric paste, thermosetting resin, and mixtures thereof. Next, the insulating material can be heated from the first state to a second state, where the second state is different from the first state in step 1020. Optionally, the insulating material can disperse or be allowed to disperse in step 1030. In another embodiment, to enhance the dispersion step 1030, the upper surface of the first integrated circuit device and an upper portion of the interconnect structure can be treated with hydrophilic plasma in step 1040 prior to the forming steps 1010, 1020, 1030.

In one embodiment, the next step includes forming the first conductive material over the insulating material in step 910, where the first conductive material extends from the upper surface of the first integrated circuit device to the upper portion of the interconnect structure. In this instance, the first conductive material can be formed with similar materials and processes as disclosed above and in steps 1010, 1020, 1030 and 1040. In this instance, the first conductive material can be deposited at a third state in step 1010, and heated in step 1020 from the third state to a fourth state, where the fourth state is different from the third state.

Like above, a semiconductor package can be mounted over the conductive material in step 912, where the semiconductor package includes a second integrated circuit device, while a plurality of external interconnects can be formed on the lower surface of the substrate in step 914 for communicating with either the first integrated circuit device or the second integrated circuit device. The upper portion of the interconnect structure can be treated with a deflashing process in step 922, which can take place after the forming step 920 but before the forming step 910. In another embodiment, the method further includes forming a second conductive material over the first conductive material in step 916. In this embodiment, the second conductive material and the first conductive material can have substantially similar geometric footprint.

In one embodiment, a method of forming conductive and insulating layers for semiconductor packages can be substantially similar to that above including: providing a substrate in step 902, mounting a first integrated circuit device and an interconnect structure over the substrate in steps 906, 908. Peripheral portions of the first integrated circuit device and the interconnect structure can be covered with an encapsulation material in step 908 leaving an upper surface of the first integrated circuit device and an upper portion of the interconnect structure exposed. Next, an insulating material can be formed over the upper surface of the first integrated circuit device in step 920. The insulating material can be formed with similar materials and processes as disclosed above and in steps 1010, 1020, 1030 and 1040. Next, a first conductive material can be formed over the insulating material in step 910, where the first conductive material extends from the upper surface of the first integrated circuit device to the upper portion of the interconnect structure. The first conductive material can be formed with similar materials and processes as disclosed above and in steps 1010, 1020, 1030 and 1040. In this instance, the first conductive material can be deposited at a third state in step 1010, and heated in step 1020 from the third state to a fourth state, where the fourth state is different from the third state.

In one embodiment, the next step includes forming an isolating material over the upper surface of the first integrated circuit device in step 918. In this embodiment, a first portion of the isolating material can be formed over the conductive material while a second portion of the isolating material can be formed in between and adjacent the conductive material. If the process had been subjected to two conductive material deposition steps 910, 916, the isolating material can be formed over both conductive materials, as well as in between and adjacent thereto. In some embodiments, the isolating material includes at least one of dielectric ink, dielectric paste, thermosetting resin, and mixtures thereof.

Like above, a semiconductor package can be mounted over the conductive material in step 912, where the semiconductor package includes a second integrated circuit device, while a plurality of external interconnects can be formed on the lower surface of the substrate in step 914 for communicating with either the first integrated circuit device or the second integrated circuit device. The upper portion of the interconnect structure can be treated with a deflashing process in step 922 after the forming step 920 but before the forming step 910.

The currently disclosed embodiments are able to deliver low cost packaging solutions including upper fan-in solution for stacked packages. In other words, an upper package with smaller or reduced footprint can be mounted over the various packages described herein. The cost savings can be realized by eliminating the need for expensive dual-sided substrates or additional substrates or interposers. The package structures are also able to achieve moderate warpage. Furthermore, thin package profiles can be achieved with fine pitch interconnects can be formed by direct writing processes including without limitation inkjet, screen printing or EHD dispensing for forming the conductive, insulating and isolating layers. In some instances, the layer patterns can be single layer or multi-layered. The upper interconnect structures can be single layer solder balls or multi-layered solder balls with metal core or polymer with metal plated core solder balls. With multi-layered solder balls, the collapse may be less during reflow versus single layer solder balls.

Although the current description has been described in detail with reference to several embodiments, additional variations and modifications exist within the scope and spirit of the disclosure.

What is claimed:

1. A method of making a semiconductor device, comprising:
   providing a substrate;
   disposing a semiconductor die over the substrate;
   depositing an encapsulant around the semiconductor die;
   forming an insulating material over a portion of the encapsulant and a portion of the semiconductor die using an inkjet printing process; and
   forming a first conductive layer over the insulating material, wherein a portion of the first conductive layer over the semiconductor die is contained completely within a footprint of the insulating material.

2. The method of claim 1, further including forming an interconnect structure over the substrate adjacent to the semiconductor die.

3. The method of claim 1, wherein forming the insulating material includes:
   depositing the insulating material in a viscous state; and
   heating the insulating material from the viscous state to a non-viscous state.

4. The method of claim 1, wherein the insulating material includes dielectric ink, dielectric paste, or thermosetting resin.

5. The method of claim 1, further including forming a second conductive layer over the first conductive layer.

6. The method of claim 1, further including forming an insulating layer over the first conductive layer.

7. A method of making a semiconductor device, comprising:
   providing a semiconductor die;
   depositing an encapsulant around the semiconductor die, wherein an upper surface of the semiconductor die is exposed from the encapsulant;
   printing an insulating material over the upper surface of the semiconductor die; and
   forming a first conductive layer over the insulating material, wherein the insulating material electrically isolates the first conductive layer from the upper surface of the semiconductor die.

8. The method of claim 7, further including:
   providing a substrate, wherein the semiconductor die is disposed over the substrate; and
   forming an interconnect structure over the substrate adjacent to the semiconductor die.

9. The method of claim 7, wherein forming the insulating material includes:
   depositing the insulating material in a viscous state; and
   heating the insulating material from the viscous state to a non-viscous second state.

10. The method of claim 7, wherein the insulating material includes dielectric ink, dielectric paste, or thermosetting resin.

11. The method of claim 7, further including printing the first conductive layer over the insulating material.

12. The method of claim 7, further including forming a second conductive layer over the first conductive layer.

13. The method of claim 7, further including forming an insulating layer over the first conductive layer.

14. A semiconductor device, comprising:
    a substrate;
    a semiconductor die disposed over the substrate;
    an encapsulant deposited around the semiconductor die;
    an insulating print material formed over the semiconductor die; and
    a first conductive layer including a contact pad formed over the insulating print material within a footprint of the semiconductor die, wherein the first conductive layer is electrically isolated from the semiconductor die by the insulating print material.

15. The semiconductor device of claim 14, further including an interconnect structure formed over the substrate adjacent to the semiconductor die.

16. The semiconductor device of claim 14, wherein the insulating print material includes dielectric ink, dielectric paste, or thermosetting resin.

17. The semiconductor device of claim 14, wherein the first conductive layer includes conductive ink or conductive liquid.

18. The semiconductor device of claim 14, further including a second conductive layer formed over the first conductive layer.

19. The semiconductor device of claim 14, further including an insulating layer formed over the first conductive layer.

20. A semiconductor device, comprising:
    a semiconductor die;
    an encapsulant deposited around the semiconductor die;
    an insulating print material on the semiconductor die; and
    a first conductive layer formed on the insulating print material, wherein the first conductive layer contacts the encapsulant outside a footprint of the semiconductor die and the first conductive layer is physically separated from the semiconductor die by the insulating print material.

21. The semiconductor device of claim 20, further including:
    a substrate, wherein the semiconductor die is disposed over the substrate; and
    an interconnect structure formed over the substrate adjacent to the semiconductor die.

22. The semiconductor device of claim 20, wherein the insulating print material includes dielectric ink, dielectric paste, or thermosetting resin.

23. The semiconductor device of claim 20, wherein the first conductive layer includes conductive ink or conductive liquid.

24. The semiconductor device of claim 20, further including a second conductive layer formed over the first conductive layer.

25. The semiconductor device of claim 20, further including an insulating layer formed over the first conductive layer.

* * * * *